(12) United States Patent
Williamson

(10) Patent No.: US 9,638,906 B2
(45) Date of Patent: May 2, 2017

(54) CATADIOPTRIC IMAGING SYSTEMS FOR DIGITAL SCANNER

(71) Applicant: Nikon Corporation, Tokyo (JP)

(72) Inventor: David M. Williamson, Tucson, AZ (US)

(73) Assignee: Nikon Corporation, Tokyo (JP)

( * ) Notice: Subject to any disclaimer, the term of this patent is extended or adjusted under 35 U.S.C. 154(b) by 100 days.

(21) Appl. No.: 14/550,465

(22) Filed: Nov. 21, 2014

(65) Prior Publication Data

US 2015/0146283 A1 May 28, 2015

Related U.S. Application Data

(60) Provisional application No. 61/907,747, filed on Nov. 22, 2013.

(51) Int. Cl.
*G02B 17/08* (2006.01)
*G03F 7/20* (2006.01)

(52) U.S. Cl.
CPC ......... *G02B 17/0892* (2013.01); *G02B 17/08* (2013.01); *G03F 7/70225* (2013.01); *G03F 7/70291* (2013.01)

(58) Field of Classification Search
CPC . G02B 17/0892; G02B 17/08–17/0896; G02B 13/143; G03F 7/70225; G03F 7/70291; G03F 7/70; G03F 7/70058; G03F 7/7015; G03F 7/702; G03F 7/70216; G03F 7/70283

(Continued)

(56) References Cited

U.S. PATENT DOCUMENTS 5,312,513 A 5/1994 Florence et al.
5,523,193 A 6/1996 Nelson
(Continued)

*Primary Examiner* — Zachary Wilkes
*Assistant Examiner* — Kristina Deherrera
(74) *Attorney, Agent, or Firm* — Yakov Sidorin; Quarles & Brady LLP

(57) ABSTRACT

Projection optical system for forming an image on a substrate and including an illumination relay lens and a projection lens each of which is a catadioptric system. The projection lens may include two portions in optical communication with one another, the first of which is dioptric and the second of which is catadioptric. In a specific case, the projection optical system satisfies $$4 < \frac{|\beta_I|}{|\beta_T|} < 30,$$

where $\beta_I$ and $\beta_T$ are magnifications of the first portion and the overall projection lens. Optionally, the projection lens may be structured to additionally satisfy $$6 < \frac{|\beta_{II}|}{|\beta_T|} < 20,$$

where $\beta_{II}$ is a magnification of the second portion. A digital scanner including such projection optical system and operating with UV light having a spectral bandwidth on the order of 1 picometer. Method for forming an image with such projection optical system.

22 Claims, 18 Drawing Sheets

(58) Field of Classification Search
USPC .......................................................... 359/355
See application file for complete search history.

(56) References Cited

U.S. PATENT DOCUMENTS

| | | |
|---|---|---|
| 7,023,610 B2 | 4/2006 | Ohtsuki et al. |
| 7,110,082 B2 | 9/2006 | Smirnov et al. |
| 7,206,117 B2 | 4/2007 | Aksyuk et al. |
| 7,760,425 B2 * | 7/2010 | Epple ................. G02B 17/0892 |
| | | 359/349 |
| 7,952,780 B2 | 5/2011 | Owa et al. |
| 7,965,378 B2 * | 6/2011 | Smirnov ............. G03F 7/70066 |
| | | 355/30 |
| 8,089,616 B2 | 1/2012 | Owa |
| 2006/0238732 A1 * | 10/2006 | Mercado ............. G03F 7/70225 |
| | | 355/55 |
| 2008/0297745 A1 * | 12/2008 | Weissenrieder .... G03F 7/70341 |
| | | 355/30 |
| 2009/0284831 A1 * | 11/2009 | Schuster .............. G02B 5/3091 |
| | | 359/355 |
| 2010/0020299 A1 * | 1/2010 | Zebala ................ G03F 7/70291 |
| | | 355/67 |
| 2013/0003166 A1 | 1/2013 | Williamson |
| 2013/0146676 A1 | 6/2013 | Johnson |
| 2013/0222781 A1 | 8/2013 | Watanabe |
| 2013/0278912 A1 | 10/2013 | Owa et al. |
| 2013/0314683 A1 | 11/2013 | Watanabe et al. |
| 2014/0211174 A1 | 7/2014 | Miyake et al. |
| 2014/0233008 A1 | 8/2014 | Tanitsu et al. |
| 2014/0320835 A1 | 10/2014 | Fujiwara |

* cited by examiner ically important aspects.
CATADIOPTRIC IMAGING SYSTEMS FOR DIGITAL SCANNER

CROSS-REFERENCE TO RELATED APPLICATIONS

The present application claims benefit of and priority from the U.S. Provisional Patent Application No. 61/907,747 filed on Nov. 22, 2013 and titled "Catadioptric Imaging Systems for Digital Scanner". The disclosure of the above-mentioned provisional application is incorporated herein by reference.

TECHNICAL FIELD

The present invention relates generally to lithographic projection optics such as that, which may be used to form an image of a reticle on a semiconductor wafer used in semiconductor manufacturing and, in particular, to lithographic projection optics that are designed to operate with numerical aperture equal to or exceeding 1.0.

BACKGROUND

Chromatic aberrations of optical projection systems that utilize refractive optical elements understandably depend on the bandwidth of light used for projecting an image of a chosen object and, depending on the severity of such aberrations, may require complex designs for aberration compensation. When an optical projection system is used in cooperation with a typical lithographic scanner, a UV-light source may be utilized the spectrum of which has a bandwidth on the order of 0.1 pm (measured as full-width-half-maximum, or FWHM, value), such as an excimer laser source, for example. However, when used in cooperation with a digital scanner (such as a Spatial Light Modulator or SLM), the operation of which is modulated at rates at which the use of the excimer laser source becomes impractical, a different source of light has to be chosen. One practically appropriate choice of a laser source for use in with a maskless projection systems designed to work with a digital scanner is a laser source (such as a solid-state laser lasing at about 193 nm) the operation of which can be modulated at the rates defined by the operation of the digital scanner. The spectral bandwidth of light of laser source however, is broader, in comparison with that of the excimer laser, by about an order of magnitude (up to about 1 pm FWHM or so). While such increase in bandwidth, in turn, leads to operationally unacceptable loss of contrast of image produced by a dioptric projection system, the reduction of the working bandwidth of this laser by using, for example, appropriate optical filters has not proven effective as it leads to the substantial reduction of the irradiance at the target surface.

Attempts were made to address the loss-of-image-contrast problem by devising such projection systems that employ an SLM and that are built around the use of a projection optics containing a catadioptric sub-portion. The proposed optical projection systems can be viewed as including two main portions or sub-systems: a first portion structured as an illumination relay configured to deliver light from a light source to the SLM and to perform what in the art is referred to as "field framing", and a second portion configured to project the light distribution from the plane of the SLM onto the image plane (the wafer) and referred to as a projection sub-system. While a projection sub-system was proposed to be structured as a catadioptric system, the illumination relay is kept conventionally dioptric (which causes, notably, an overall optical projection system to be sometimes impractically long, unless the optical path is intentionally folded with plane mirrors). It is recognized that the existing solutions still require improvements with respect to several operationally important aspects.

For example, the teachings of U.S. Pat. No. 5,523,193, while describing the basic principle of imaging of light distribution from the SLM onto the wafer, does not provide an enabling optical design for an optical projection system and, in particular, the design of an optical system that can operate at hyper-NAs that are greater than 1.0. Moreover, the described projection optics does not address the current needs in a 26-mm field size on the semiconductor wafer. Such projection optics is limited, therefore, in both the optical throughput and optical resolution that is can provide.

In U.S. Pat. No. 7,110,082, for example, an SLM-based imaging system is disclosed that utilizes a projection system with a beamsplitter in the illumination relay sub-system (to allow the on-axial illumination of the SLM without obscuration) and the projection sub-system. The described system is limited in the maximum value of the NA that can be achieved considering the practical limitations on the size of high-quality optical glass used for the fabrication of a beamsplitter of the system. In addition, the beamsplitter in this imaging system is either rather inefficient in terms of light transmission, or/and precludes the use of polarized light. The un-addressed by the related art ability of the projection system to operate in polarized light would be understandably advantageous to achieve high spatial resolution that is required to take full advantage of a hyper-NA with values exceeding 1.0.

A solution proposed in U.S. 2013/0003166 is not fully addressing an issue of compatibility of the optical projection system with a digital scanner. Indeed, while a typical digital scanner is capable of operating at high reduction ratios of 50× or, for example, even 200× (to facilitate fabrication and use of relatively geometrically large SLM pixels and reduction of the image size of such pixels to 20 nm on the semiconductor wafer), the disclosed solution enables only a relatively lower reduction ratio of 10×. In addition, U.S. 2013/0003166 is silent with respect to the design of the illumination relay portion of the overall projection system.

Accordingly, at least the greater-than-acceptable levels of chromatic aberrations in existing projection systems and insufficient reduction ratios define a need in redesign of an optical projection system for efficient use in conjunction with a digital scanner.

SUMMARY OF THE INVENTION

Embodiments of the invention provide a projection optical system for forming an image on a substrate and including a catadioptric illumination relay lens and a catadioptric projection lens. A projection optical system may include a spatial light modulator (SLM) positioned to receive light from the catadioptric illumination relay lens and reflect said light towards the catadioptric projection lens. The numerical aperture of the projection optical system is equal to or exceeds 1.0, while the image is formed with a size reduction ratio of at least 50×. When structured to operate at such reduction ratio and in UV light having a central wavelength of about 193.3 nm and a spectral bandwidth of about 1 picometer, the operation of the projection system is characterized by a first Strehl ratio at the central wavelength and a second Strehl ratio across the spectral bandwidth, both of which exceed 0.95. When structured to operate at a reduction ratio of 200× and in the same UV light, both the first and second Strehl ratios exceed 0.98. Embodiments also provide a digital scanner comprising such projection optical system.

Embodiments of the invention further provide a projection optical system comprising a spatial light modulator (SLM) disposed to receive radiation from a catadioptric illuminator relay and reflect the radiation to a catadioptric projection lens to form an image such that chromatic errors induced in the image are at least partially reduced. For example, a Strehl ratio characterizing the operation of an embodiment in UV light having a central wavelength of about 193.3 nm and a spectral bandwidth of about 1 picometer exceed 0.95. Alternatively or in addition, embodiment of the invention provides a digital scanner including such projection optical system.

BRIEF DESCRIPTION OF THE DRAWINGS

The invention will be more fully understood by referring to the following Detailed Description in conjunction with the generally not-to-scale schematic Drawings, of which.

DETAILED DESCRIPTION

Figure 1A:
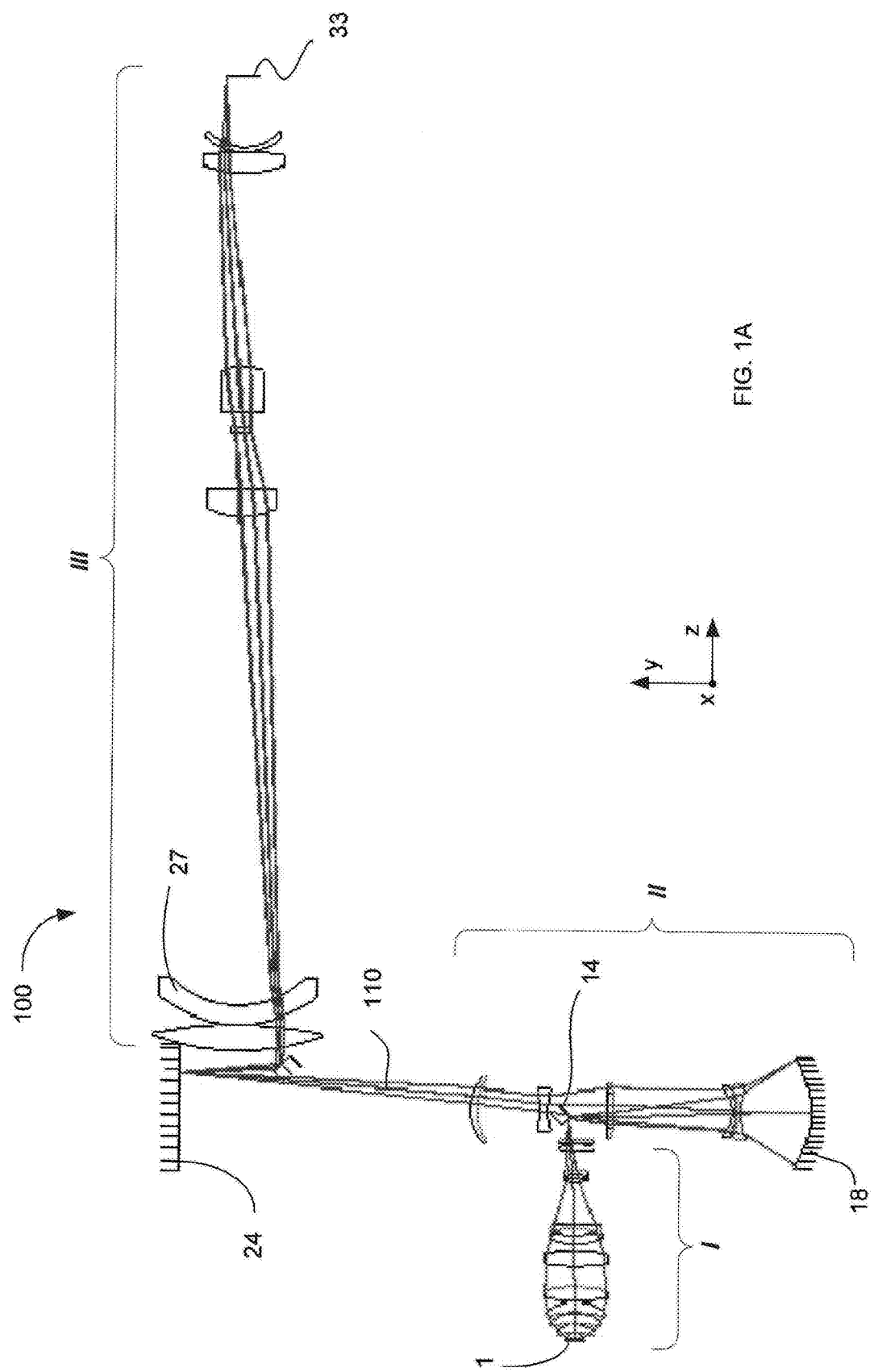
FIG. 1A is a diagram illustrating a conventionally-structured optical imaging system delivering light from a filed framing plane through an SLM and containing an 0.5× dioptric illuminator relay and a 50× catadioptric projection lens.

Embodiments of the present invention provide a solution for the lack of a hyper-NA (i.e., with NA values exceeding 1.0 and equal to, for example, 1.35) high reduction ratio (50× to 200×, for example) optical projection system configured for efficient use with a digital scanner, which system is operable, for practical lithographic purposes, across a spectral bandwidth of light on the order or 1 pm without substantial loss of image contrast caused by chromatic aberrations. Embodiments include optical projection systems in which both the illumination relay sub-portion and the projection sub-portion are catadioptric.

While one can attempt to argue that the precise and accurate performance of the projection sub-system (i.e., a sub-system of the overall projection system that re-images light from the SLM onto the wafer) may be more critical than that of the illumination relay sub-system because the actual semiconductor circuit structure is produced by reimaging the SLM onto the wafer, the design data discussed below prove that continued utilization of a conventionally dioptrically-designed illumination relay sub-system leads to substantial underperformance of the overall projection system.

Specifically, a comparison of operational characteristics of (i) a conventional projection system including a 0.5× dioptric illumination relay subsystem (interchangeably referred to herein as an "illuminator relay") and a 50× catadioptric projection sub-system (interchangeably referred to herein as a "catadioptric projection lens") and those of (ii) an embodiment of the present invention including a 0.5× catadioptric illuminator relay and a 50× catadioptric projection lens is provided. Also are analyzed (and compared with one another) operational characteristics of (iii) a conventionally-designed system combining a 0.5× dioptic illuminator relay with a 200× catadioptric projection lens and those of (iv) an embodiment of the invention combining the 0.5× dioptic illuminator relay with a 200× catadioptric projection lens.

Several additional notes are in order for ease of understanding of the following disclosure. Tables 1 through 4 in the following discussion summarize the prescriptions for designs of various optical systems and their subsystems that were performed with Code V and that are discussed in reference to corresponding Figures. In these Tables, optical elements are numbered in a "backward" fashion, starting with the semiconductor wafer (defining the image plane) towards the source of light, which makes it easier, as would be appreciated by a skilled artisan, to define the NA and telecentricity in wafer space during the process of optical design. The semiconductor wafer (with a wafer plane labeled as 1 in the Tables) is submerged in fluid (for example, water, as shown in inset of FIG. 1B) that separates the closest lens (marked as element 2 in the Tables) from it. This condition applies to each of the presented embodiments. Positive radius value indicates that the center of curvature is to the right, while a negative radius value indicates that the center of curvature is to the left; dimensions are provided in millimeters; thickness is defined as an axial distance to the next surface; and an indicated image diameter is a paraxial value and not a ray traced value. Furthermore, with respect to decentering constants, a decenter defines a new coordinate system (displaced and/or rotated) in which subsequent surfaces are defined. Surfaces following a decenter are aligned on the local mechanical axis (z-axis) of the new coordinate system. The new mechanical axis remains in use for referencing purposes until expressly changed by another decenter. The order in which displacements and tilts are applied to a given surface is specified using different decenter types and these generate different new coordinate systems; those used in this disclosure are explained below. Alpha, beta, and gamma values are presented in degrees. Additionally, with respect to chromatic aberrations, a reduction in Strehl ratio between monochromatic and polychromatic deigns represents the contrast loss from chromatic aberrations over the specified spectral band, while a variation in best individual focus shows the residual field curvature.

An embodiment of the catadioptric optical projection system according to the invention is designed to ensure, in operation, at least a 50× reduction ratio and is characterized by a hyper-NA (of at least 1.0) catadioptric projection lens and an instantaneous line field of view (one dimensional, 1D, FOV) of about 3.6 mm on the surface of the wafer. The projection optical system is structured to be compatible with principles of maskless lithography, according to which the conventionally used mask (or reticle) is replaced by an SLM. The SLM may take a form of a 1D array of microelectromechanical actuators, or MEMS, for example, or actuators on the scale of a few tens or hundreds of nanometers (NEMS). U.S. patent documents U.S. Pat. Nos. 5,523,193; 7,110,082; and 2013/0003166, the disclosure of each of which is incorporated by reference herein, provide additional information on SLM technology.

Example 1

Catadioptric Embodiment with a 50× Reduction Ratio

FIGS. 1A, 1B, 1C, and 1D illustrate an optical imaging system 100 providing a 50× reduction ratio and structured conventionally in that, while the projection lens portion (I and II) includes a catadioptric optical system, the illumination relay portion (III) is dioptric. To illustrate contradistinctively advantageous operational characteristics of a fully-catadioptric system configured according to an embodiment of the present invention, a comparison is made with a 50×-reducing optical system of FIGS. 2A and 2B, in which each of the projection lens portion (I and II) and the illuminator relay (III-CAT) is structured as a catadioptric system. For the purposes of comparison, the projection lens portions of both the system of FIG. 1A and the embodiment of FIG. 2A are identical.

Figure 1B:
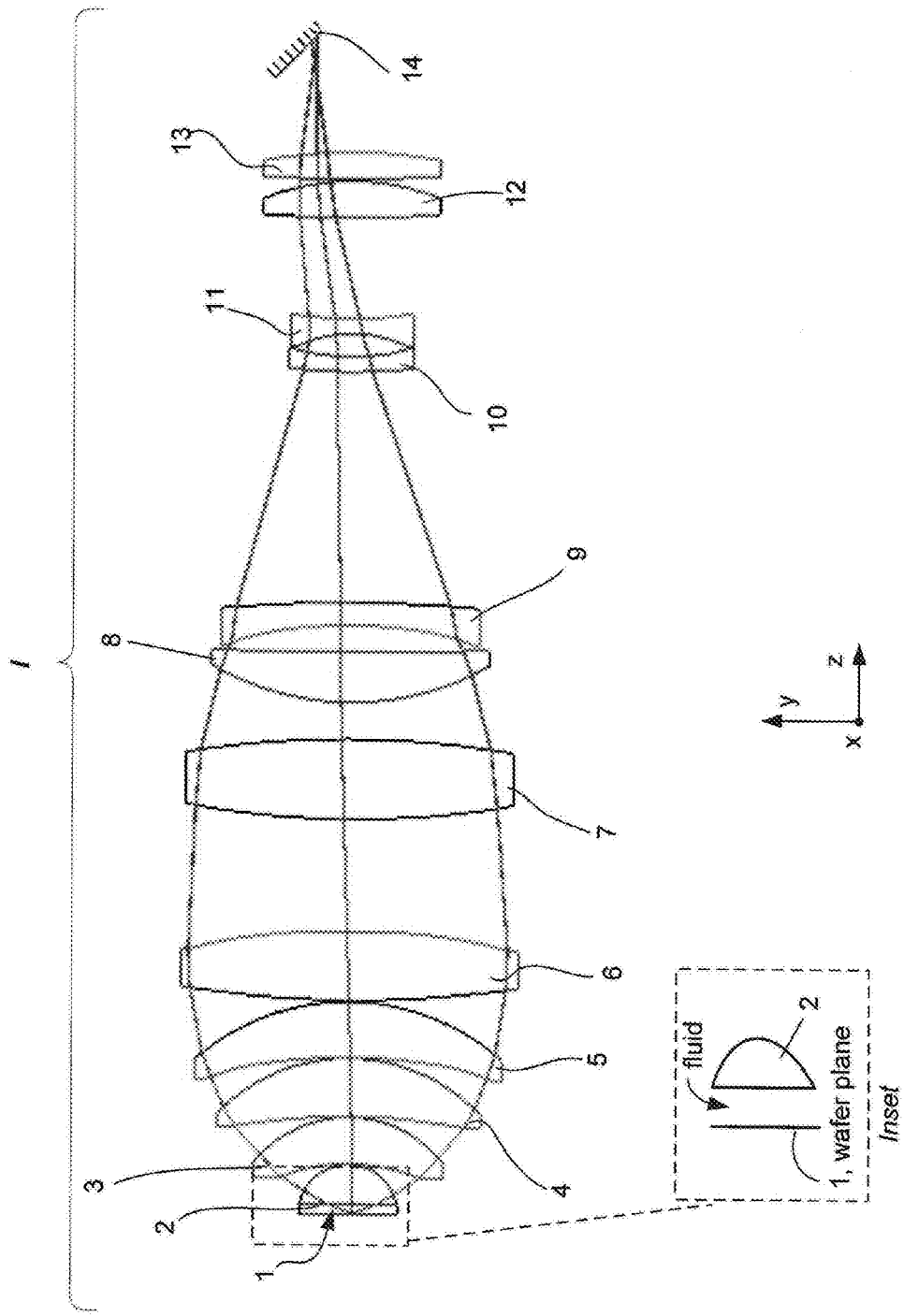
FIG. 1B is a diagram illustrating a first portion of the catadioptric projection lens of the embodiment of FIG. 1A.
Figure 1C:
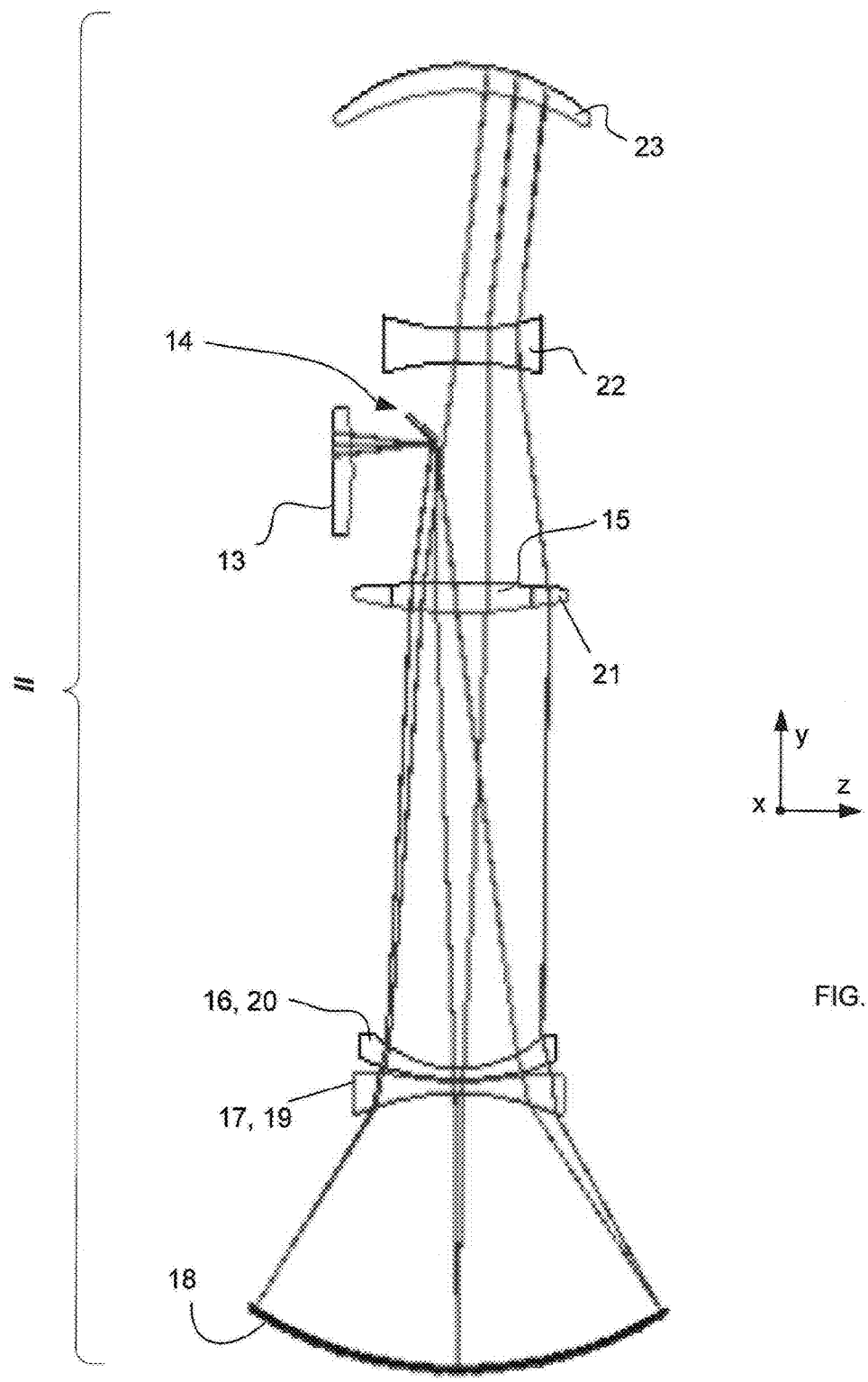
FIG. 1C is a diagram illustrating a second portion of the catadioptric projection lens of the embodiment of FIG. 1A.
Figure 1D:
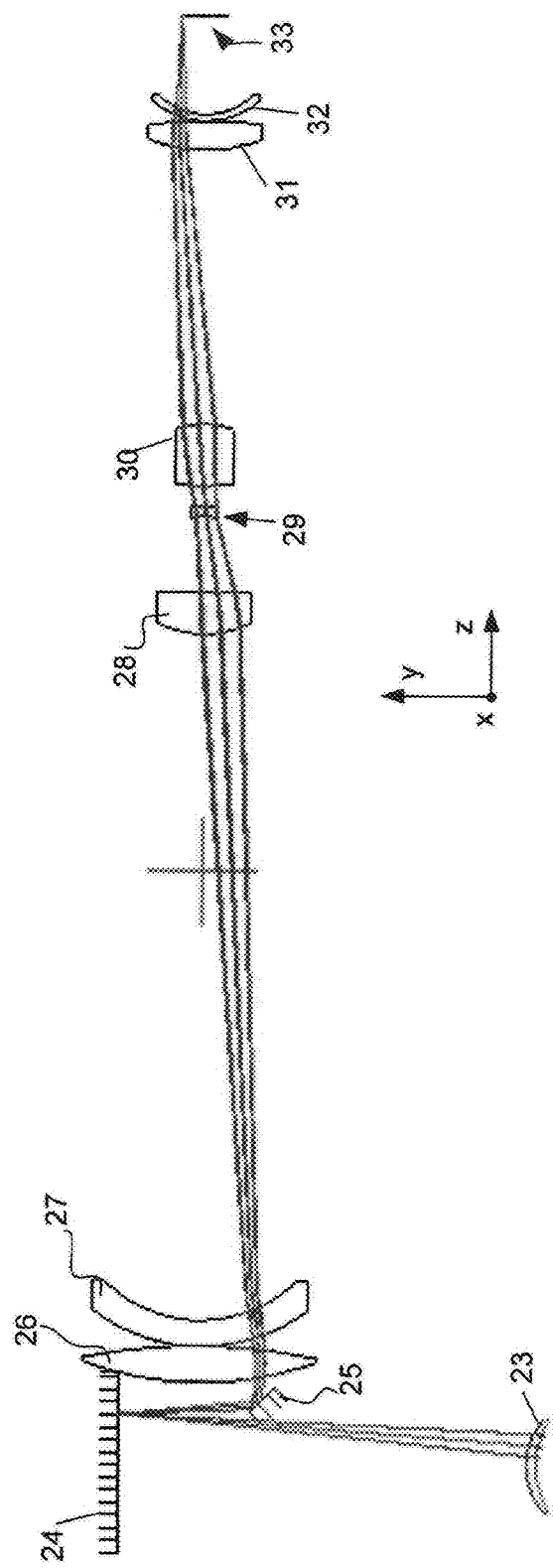
FIG. 1D is a diagram providing details of the dioptric illuminator relay of the embodiment of FIG. 1A.

As shown in FIG. 1A, the illumination relay III images a field framing plane (element 33 that is illuminated with a telecentric system, not shown) onto the plane of the SLM (element 24) with a 2× magnification. The light-beam 110 further passes, upon reflection from the SLM (element 24), without obscuration into the catadioptric projection sub-system (II and I) that reduced the image on the surface of the wafer (element 1) by 50×. FIGS. 1B, 1C, and 1D show the details of sub-portions of the embodiment 100.

Figure 2A:
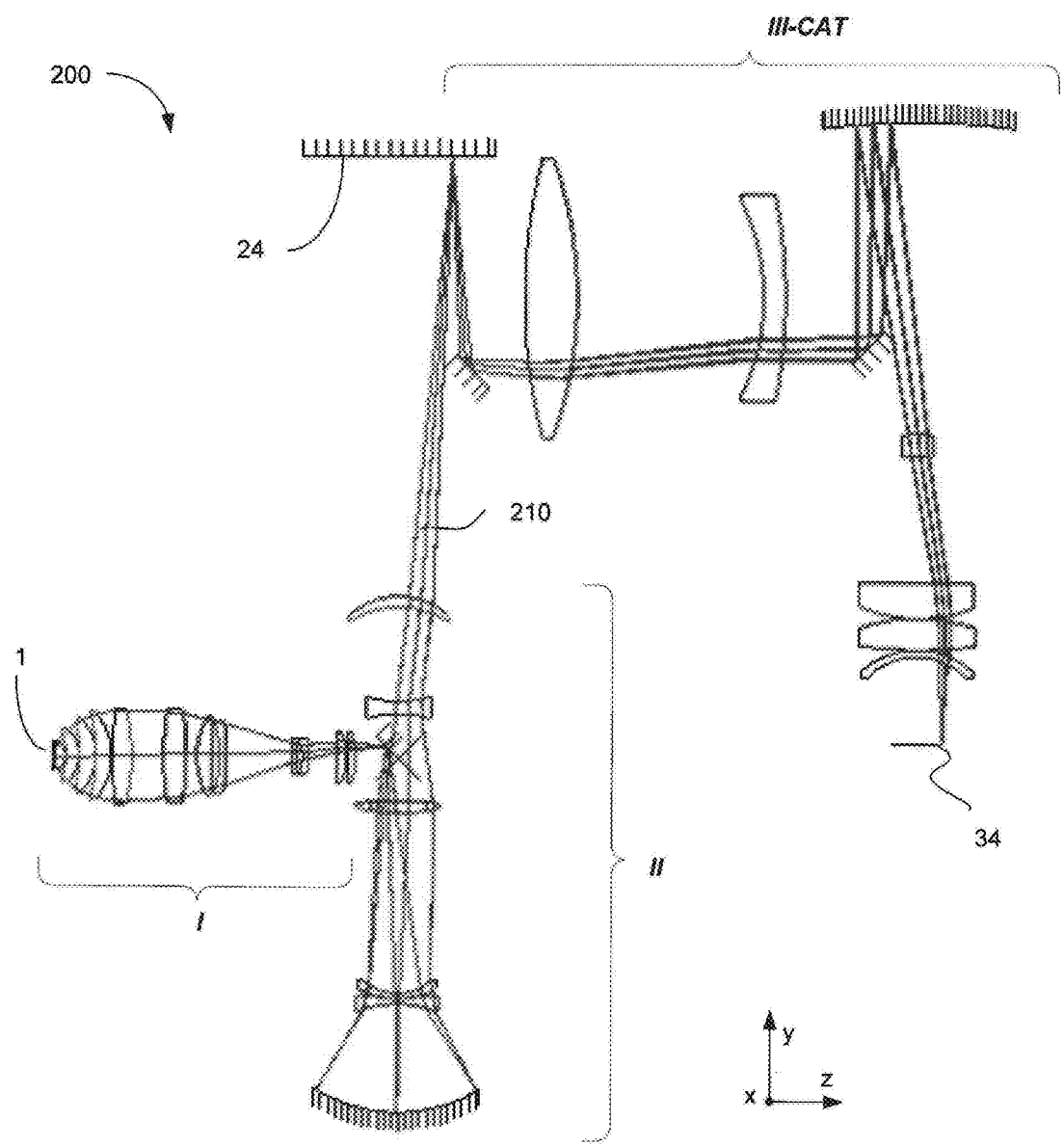
FIG. 2A is a diagram of an optical imaging system according to an embodiment of the invention structured to deliver light from a filed framing plane through an SLM and containing the same 50× catadioptric projection lens as the embodiment of FIG. 1A but in which the illuminator relay is structured as a 0.5× catadioptric sub-system.
Figure 2B:
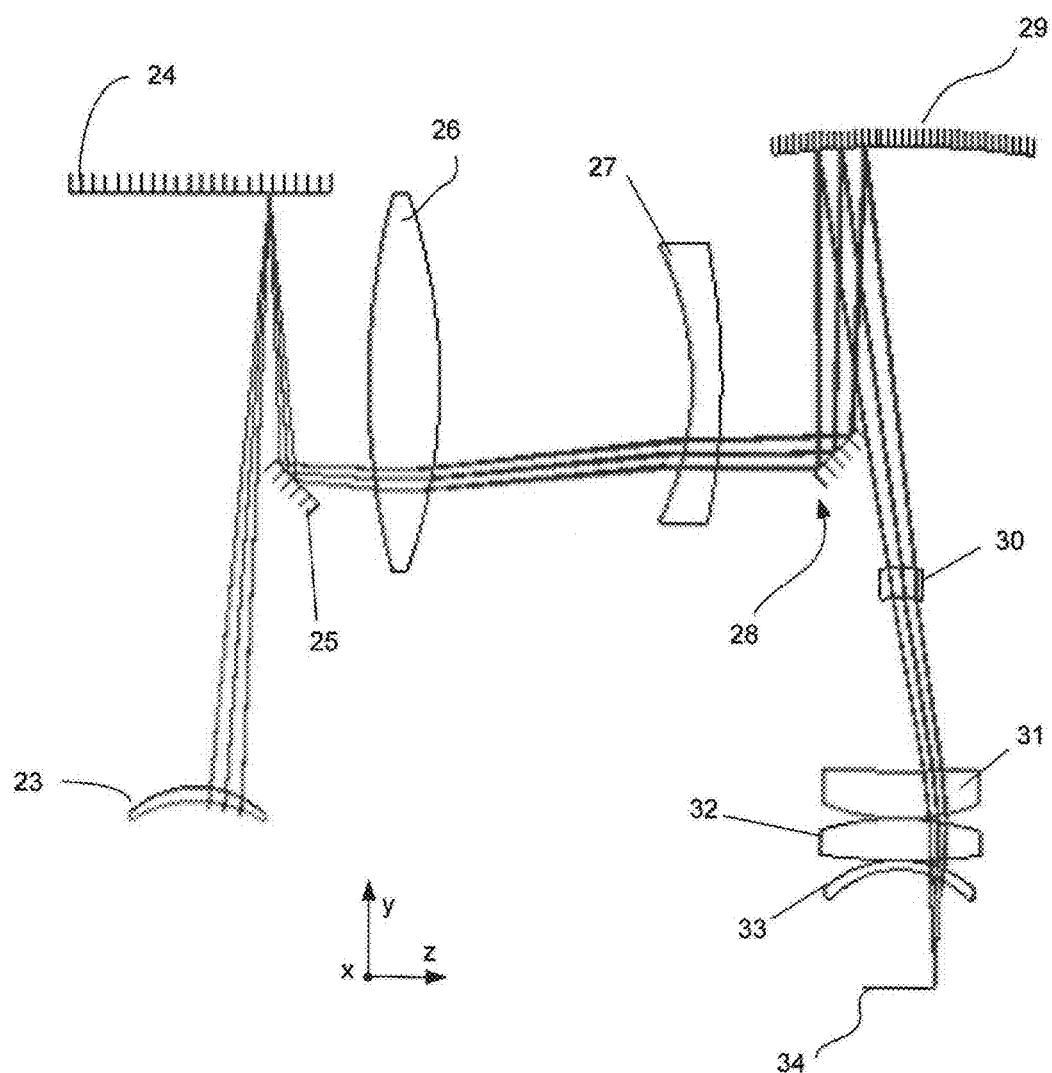
FIG. 2B is a diagram providing details of the catadioptric illuminator relay of the embodiment of FIG. 2A.

As shown in FIG. 2A, the embodiment 200 of the present invention includes the catadioptric projection sub-system (the combination of II and I) that is the same as in the embodiment 100, operably concatenated with the catadioptric illumination relay (III-CAT). The catadioptric illumination relay III-CAT images a field framing plane (element 34 that is illuminated with a telecentric system, not shown) onto the plane of the SLM (element 24) with a 2× magnification. The light-beam 210 further passes, upon reflection from the SLM (element 24), without obscuration into the catadioptric projection sub-system (II and I) that reduced the image on the surface of the wafer (element 1) by 50×. The resulting size of the rectangular image on the wafer surface is about $3.6 \times 0.16$ mm$^2$, which corresponds to about $180 \times 8$ mm$^2$ light distribution at the plane of the SLM and to about $90 \times 4$ mm$^2$ at the field framing plane (element 34). Optionally, blades may be utilized in the field framing plane to define sharply and/or further limit the size of the field. FIG. 2B shows the details of the optical train of the catadioptric illuminator relay III-CAT In both embodiments 100 and 200 (FIGS. 1A and 2A, respectively), the long dimension of the field is extended perpendicularly to the plane of the drawing (or parallel to the x-axis, as indicated). In both embodiments 100 and 200, the SLM (element 24) contains a 1D array of microreflectors that is perpendicular to the plane of the corresponding drawings and is slightly more than 180 mm in length. In both embodiment the SLM is illuminated through the corresponding illumination relay (III, III-CAT) with light delivered from a high-repetition (~1 MHz) UV laser source having a specified spectral bandwidth around the central wavelength of about 193 nm. The laser source used for SLM-utilizing projection optical system of the invention has a bandwidth that is about 30-fold that of a typical UV excimer laser (employed with a conventional scanner used in lithography), and has a repetition rate exceeding that of the excimer laser by about three orders of magnitude. The detailed Code V description of the optical train of the embodiment 100 is presented in Table 1A, while the corresponding description of the optical train of the embodiment of the invention 200 is presented in Table 2A.

In comparison with the design of the illumination relay III of the embodiment of FIG. 1A, and as detailed in Table 2A, the catadioptric illumination relay III-CAT includes a spherical mirror (element 29). The catadioptric projection lens (I, II) of either embodiment 100 or 200 also comprises a spherical mirror and a fold mirror (elements 14, 18), but in addition forms an intermediate image close to the fold mirror (element 14) and a number of aspheric lens elements (such as, for example, elements 13, 15, 17) that, in conjunction with the relay III-CAT, facilitate hyper-NA of 1.35 at the immersed in water wafer surface.

Figure 5A:
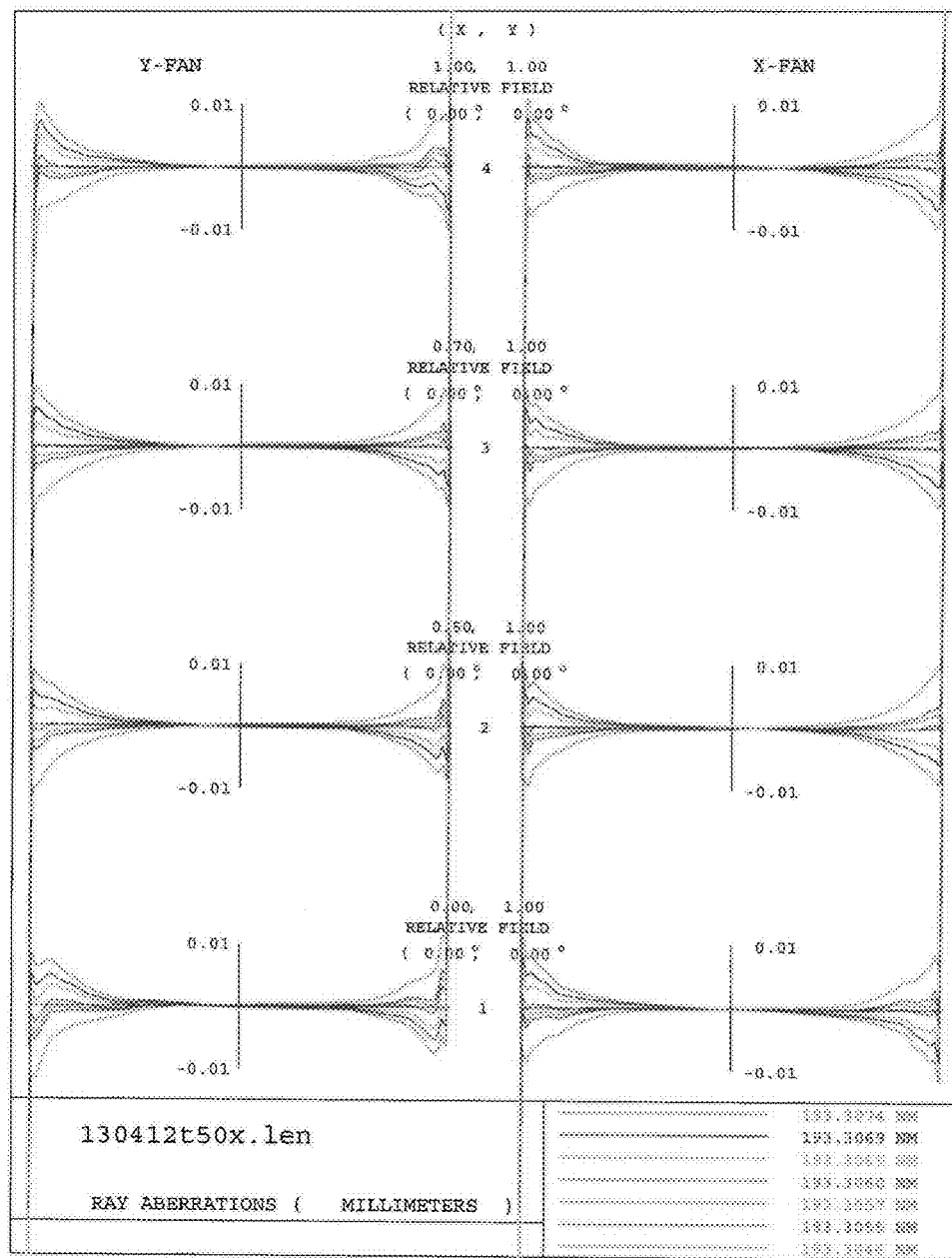
FIG. 5A shows plots representing ray aberrations, within a defined spectral bandwidth around the operating wavelength, at a plane of the SLM (element 24) of the embodiment of FIG. 1A.
Figure 5B:
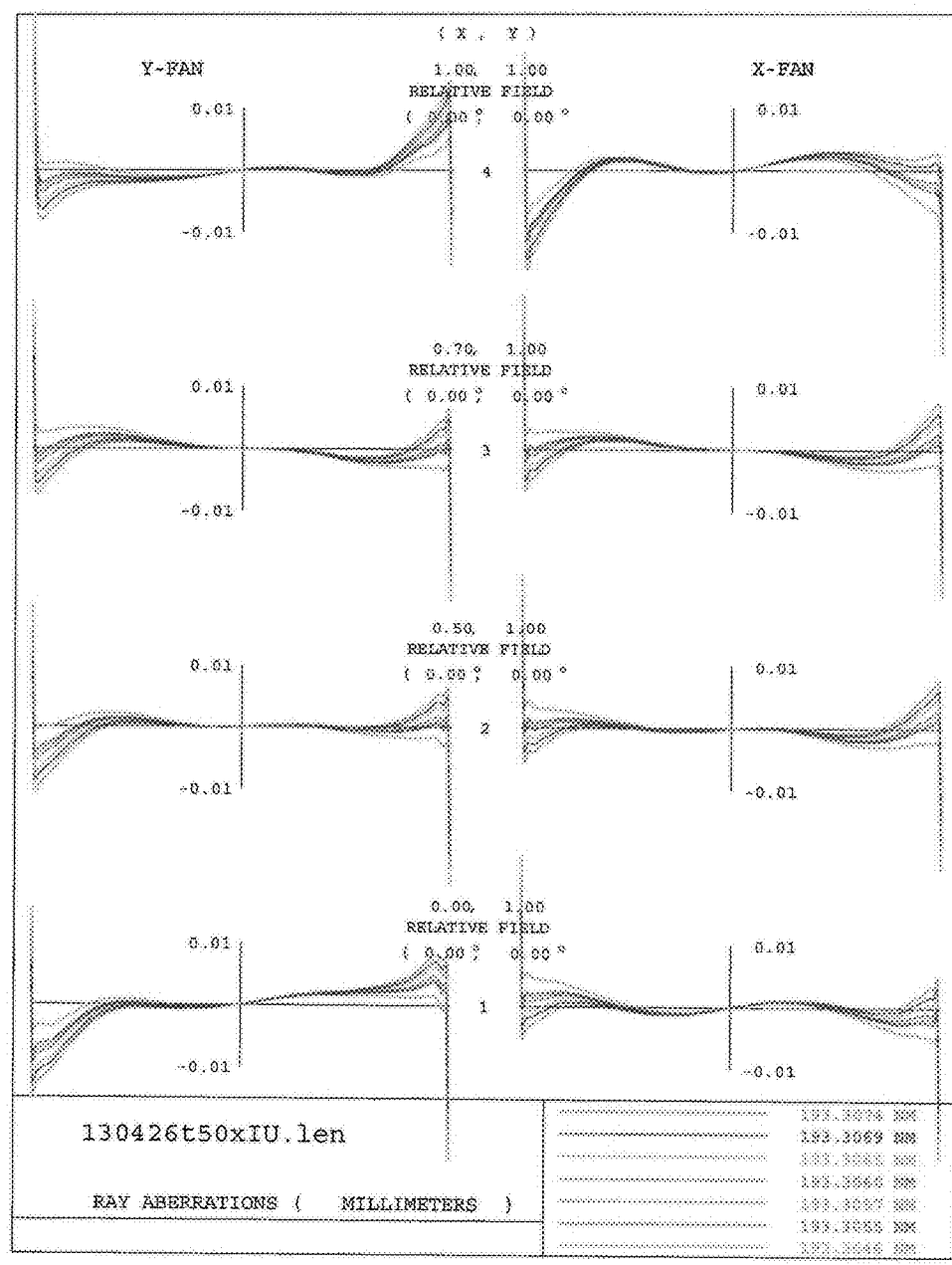
FIG. 5B shows plots representing ray aberrations, within a defined spectral bandwidth around the operating wavelength, in the image plane (wafer) of the embodiment of FIG. 1A.
Figure 6:
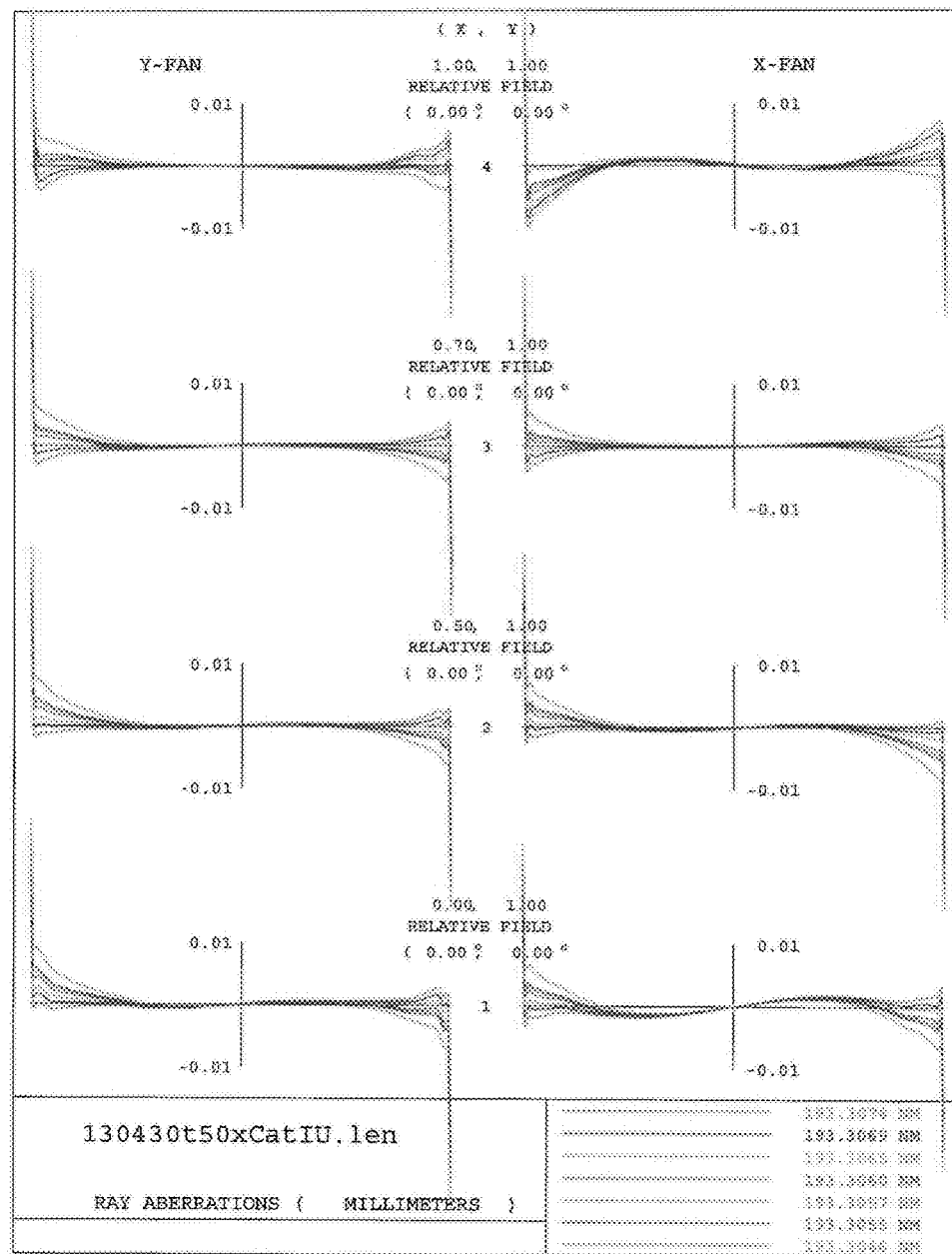
FIG. 6 shows plots representing ray aberrations, within a defined spectral bandwidth around the operating wavelength, in the image plane (wafer) of the embodiment of FIG. 2A.

Descriptions of aberrations characterizing imaging through the catadioptric lens I, II of the embodiment 100 of the field framing plane 33 of the embodiment 100 of FIG. 1A onto the surface of the wafer 1 are presented in FIG. 5A and Tables 1B, 1C. Table 1B address the ray aberrations at the plane of the SLM (at wavelengths in an approximately 3 pm-wide spectral bandwidth centered at about 193.3 nm), and wavefront aberrations associated with the imaging through the catadioptric lens I, II of the embodiment 100). Table 1C addresses the wavefront aberrations associated with the imaging through the overall optical system of the embodiment 100, between the field framing plane 33 of the embodiment 100 and the surface of the wafer 1. FIG. 5B complements the data of FIG. 1A by providing lots of ray aberrations defined, for the embodiment of FIG. 1A, in the image plane (wafer) within a defined spectral bandwidth around the operating wavelengths. Descriptions of aberrations characterizing imaging through the overall optical system of the embodiment 200 of the invention, between the field framing plane 34 of the embodiment 200 and the surface of the wafer 1 of FIG. 2A, are summarized in FIG. 6 and Table 2B (addressing the ray aberrations and wavefront aberrations, respectively). The direct comparison between the data on aberrations for the fully-catadioptric projection lens according to the idea of the invention with those for a conventional lens highlights the advantages of the embodiment of the invention, as would be recognized by a skilled artisan.

A person of skill in the art will readily appreciate, from the data of Tables 2B and 1C, for example, that the field curvature of the fully-catadioptric design of the invention (shown in a column representing the focus position as a function of field height) is substantially smaller than that of a conventionally-design system 100. Moreover, the difference between the figures of merits describing the polychromatic aberrations and those describing monochromatic aberrations is substantially smaller for the embodiment 200 of the invention as compared to the embodiment 100. Furthermore, the values of Strehl ratio across the field for the embodiment 200 of the invention are substantially higher than those for the embodiment 100 (see, for example, Strehl ratios respectively characterizing monochromatic rms wavefront aberrations). The embodiment of the invention ensures, in addition to operationally negligible distortion of imaging between the SLM and the wafer, very small residual monochromatic aberrations on the order of about 5 milliwaves rms or less.

Example 2

Catadioptric Embodiment with 200× Reduction Ratio

Figure 3A:
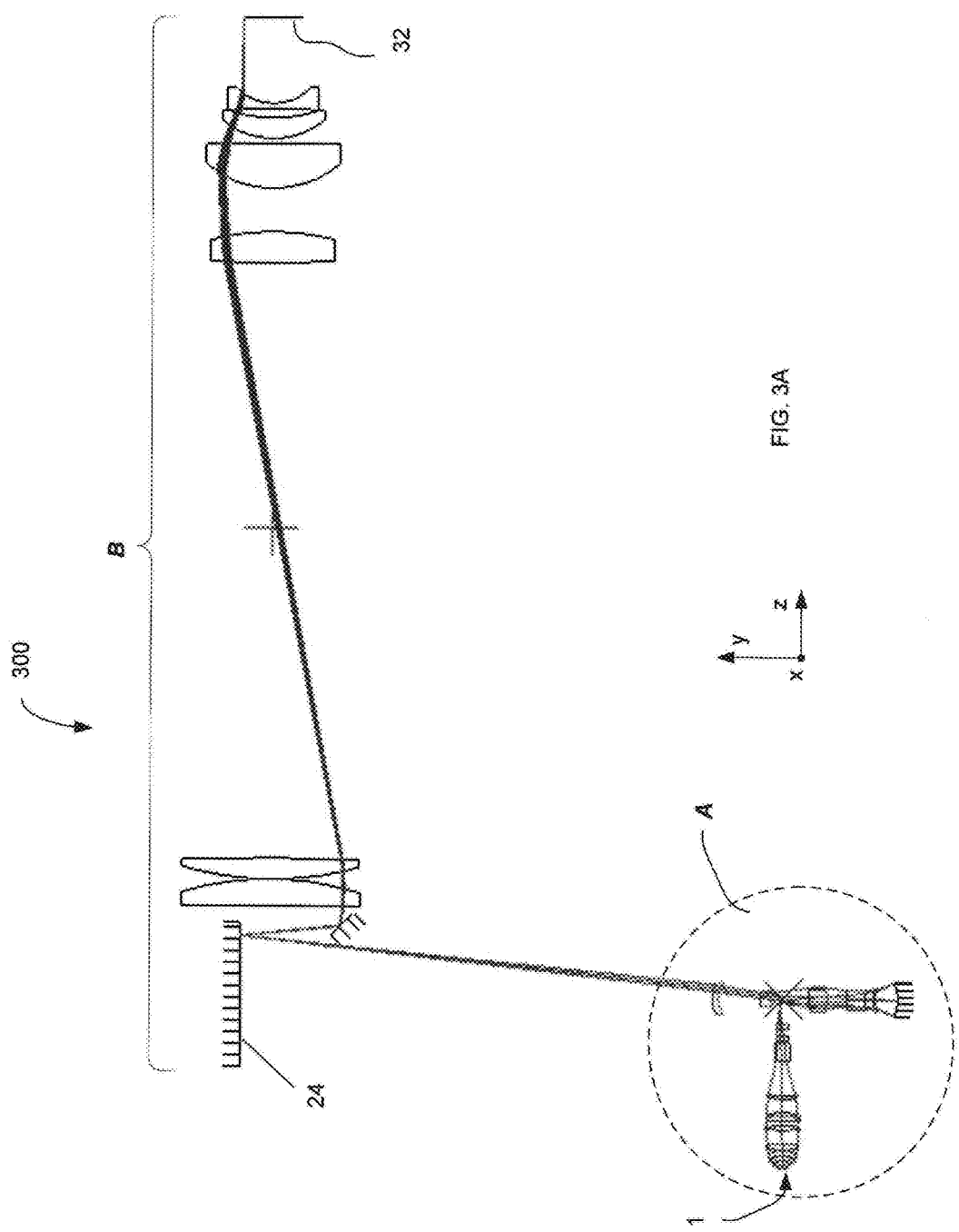
FIG. 3A is a diagram illustrating a conventionally-structured optical imaging system delivering light from a filed framing plane through an SLM and containing an 0.5× dioptric illuminator relay and a 200× catadioptric projection lens.
Figure 3B:
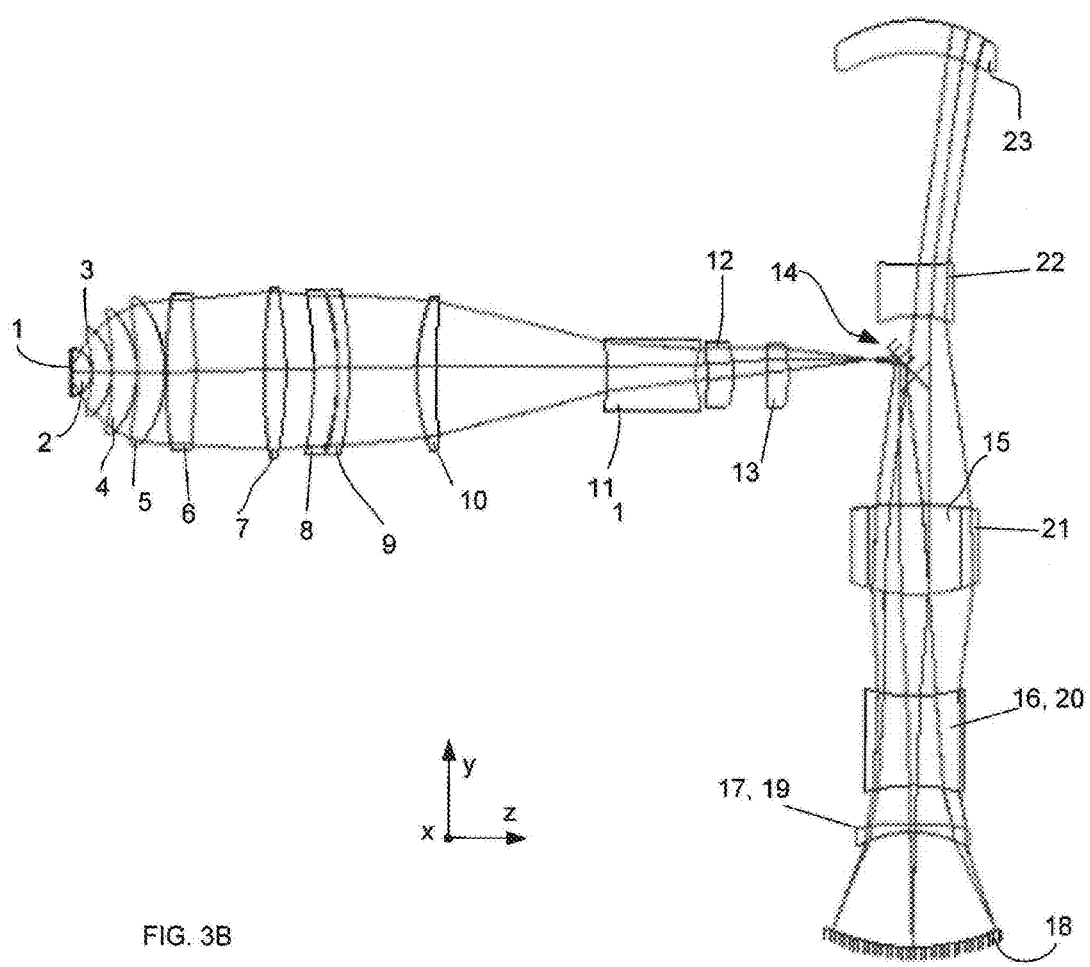
FIG. 3B is a diagram illustrating the catadioptric projection lens of the embodiment of FIG. 3A.
Figure 3C:
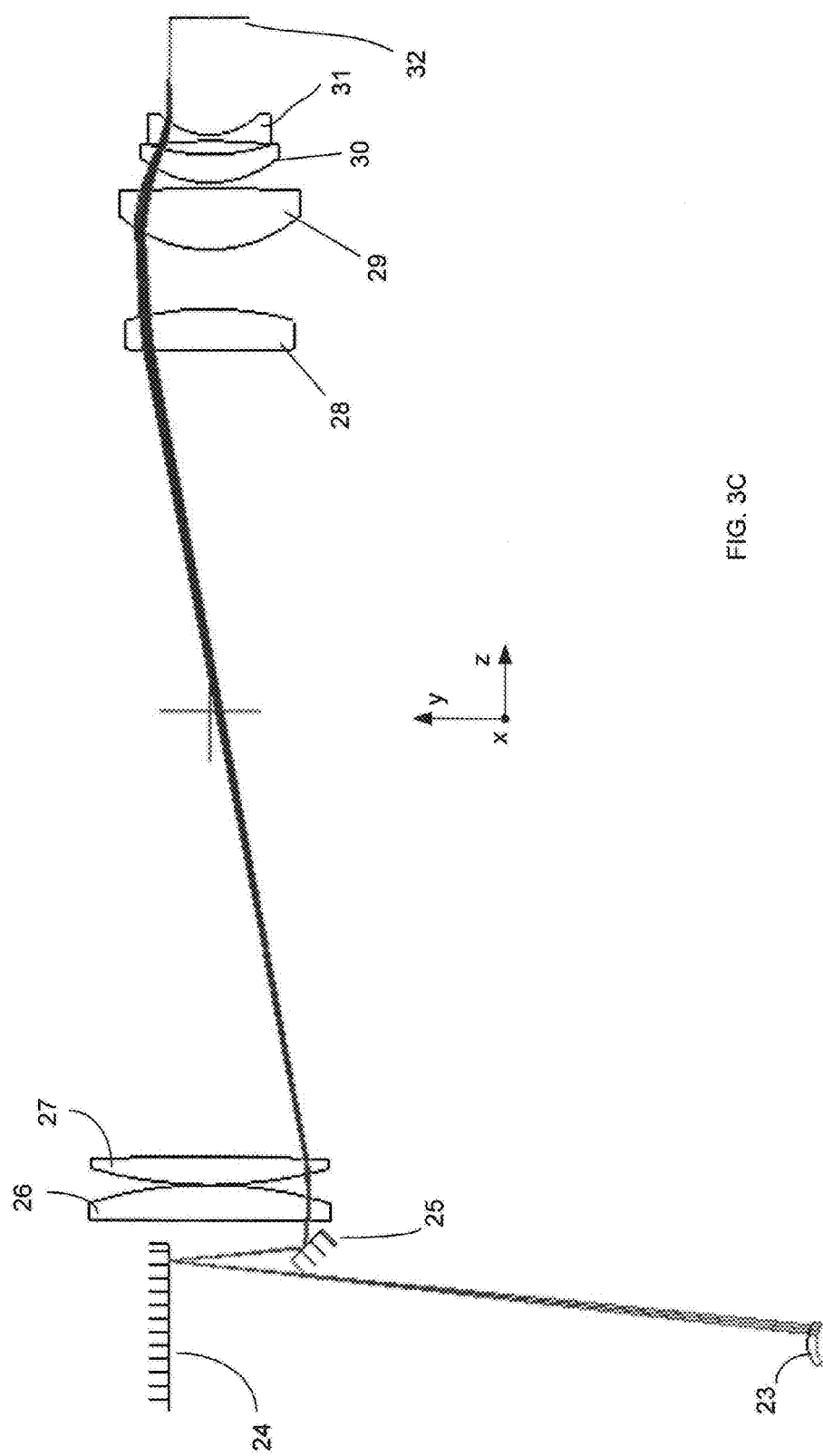
FIG. 3C is a diagram providing details of the dioptric illuminator relay of the embodiment of FIG. 3A.
Figure 4:
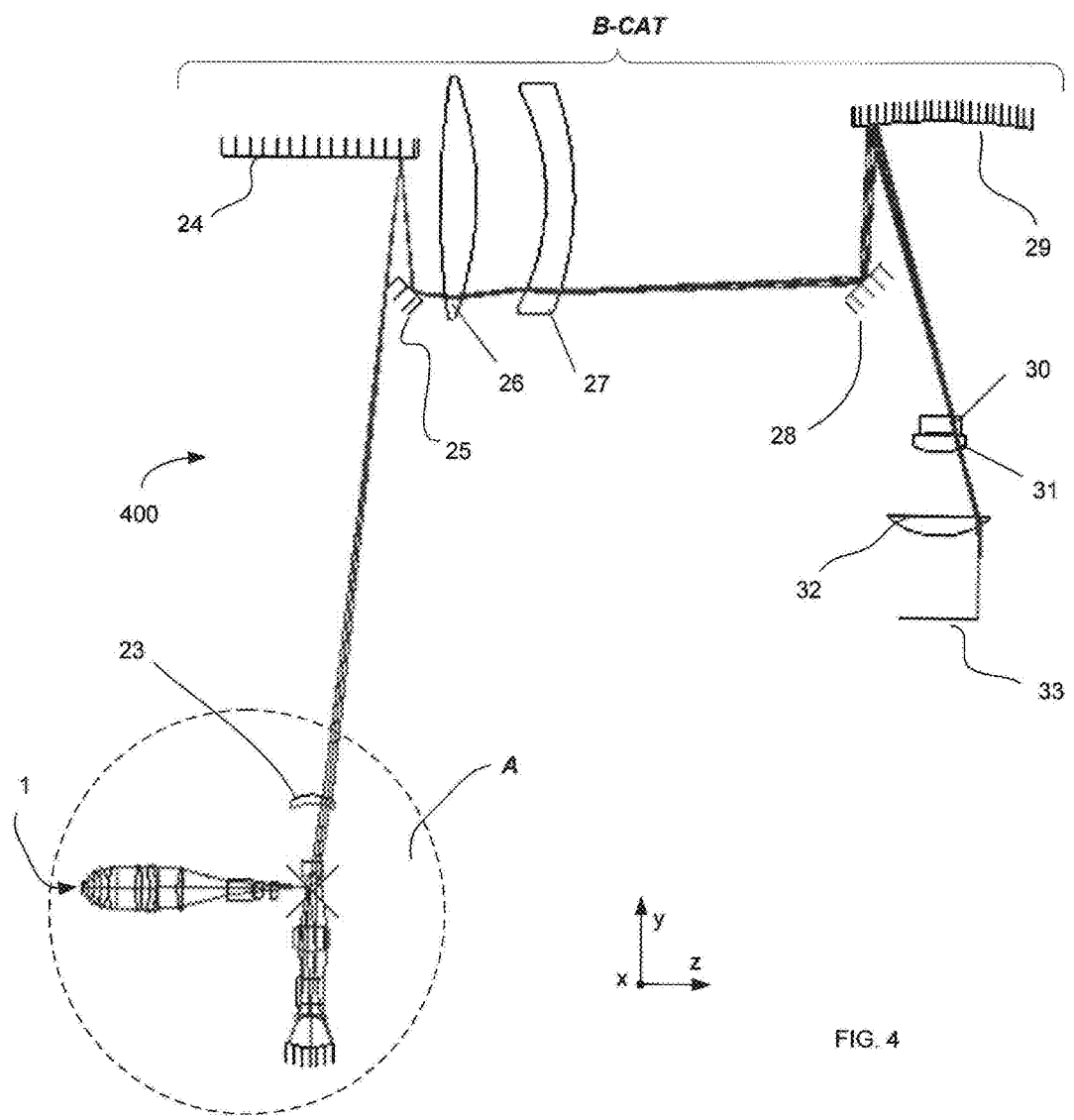
FIG. 4 is a diagram of an optical imaging system according to an embodiment of the invention structured to deliver light from a filed framing plane through an SLM and containing the same 200× catadioptric projection lens as the embodiment of FIG. 3A but in which the illuminator relay is structured as a 0.5× catadioptric sub-system.

FIGS. 3A, 3B, 3C illustrate an optical imaging system 300 providing a 200× reduction ratio and structured conventionally in that, while the projection lens portion (A) includes a catadioptric optical system, the illumination relay portion (B) is conventionally dioptric. To illustrate contradistinctively advantageous operational characteristics of a fully-catadioptric system according to an embodiment of the present invention, a comparison is made with a 200×-reducing optical system of FIG. 4, in which both the projection lens portion (A) and the illuminator relay (B-CAT) are structured as catadioptric systems. For the purposes of the comparison, the projection lens portions of both the system of FIG. 3A and the embodiment of FIG. 4 are identical. FIGS. 3B and 3C show the details of sub-portions of the embodiment 300.

As shown in FIG. 4, the embodiment 400 of the present invention includes the catadioptric 200×-reduction projection sub-system (A) that is the same as that of the embodiment 300, concatenated with the catadioptric illumination relay B-CAT that images a field framing plane (element 33, illuminated with a telecentric system, not shown) onto the plane of the SLM (element 24) with a 2× magnification. The resulting size of the rectangular image on the wafer surface (1) is about 0.64×0.16 mm$^2$, which corresponds to about 128×32 mm$^2$ light distribution at the plane of the SLM and to about 64×16 mm$^2$ at the field framing plane (element 33). Optionally, blades may be utilized in the field framing plane to define sharply and/or further limit the size of the field. FIG. 2B shows the details of the optical train of the catadioptric illuminator relay III-CAT In both embodiments 300 and 300 (FIGS. 1A and 2A, respectively), the long dimension of the field is perpendicular to the plane of the drawing (or parallel to the x-axis, as indicated). The parameters of illuminating UV light used to design the optical trains of the embodiment 300 (presented in Table 3A) and the optical train of the embodiment of the invention 400 (presented in Table 4A) are the same as those discussed in reference to FIGS. 1A, 2A.

In comparison with the design of the illumination relay B of the embodiment 300 of FIG. 3A, and as detailed in Table 4A, the catadioptric illumination relay B-CAT includes one spherical mirror (element 29) and one extra fold planar mirror (element 28). The catadioptric projection lens (A) of either embodiment 300 or 400 also comprises a spherical mirror and a fold mirror, but in addition forms an intermediate image close to the fold mirror (element 14) and a number of aspheric lens elements that, in conjunction with the relay B-CAT, facilitate hyper-NA of 1.35 for the fully-catadioptric embodiment 400 at the immersed in water wafer surface.

Figure 7A:
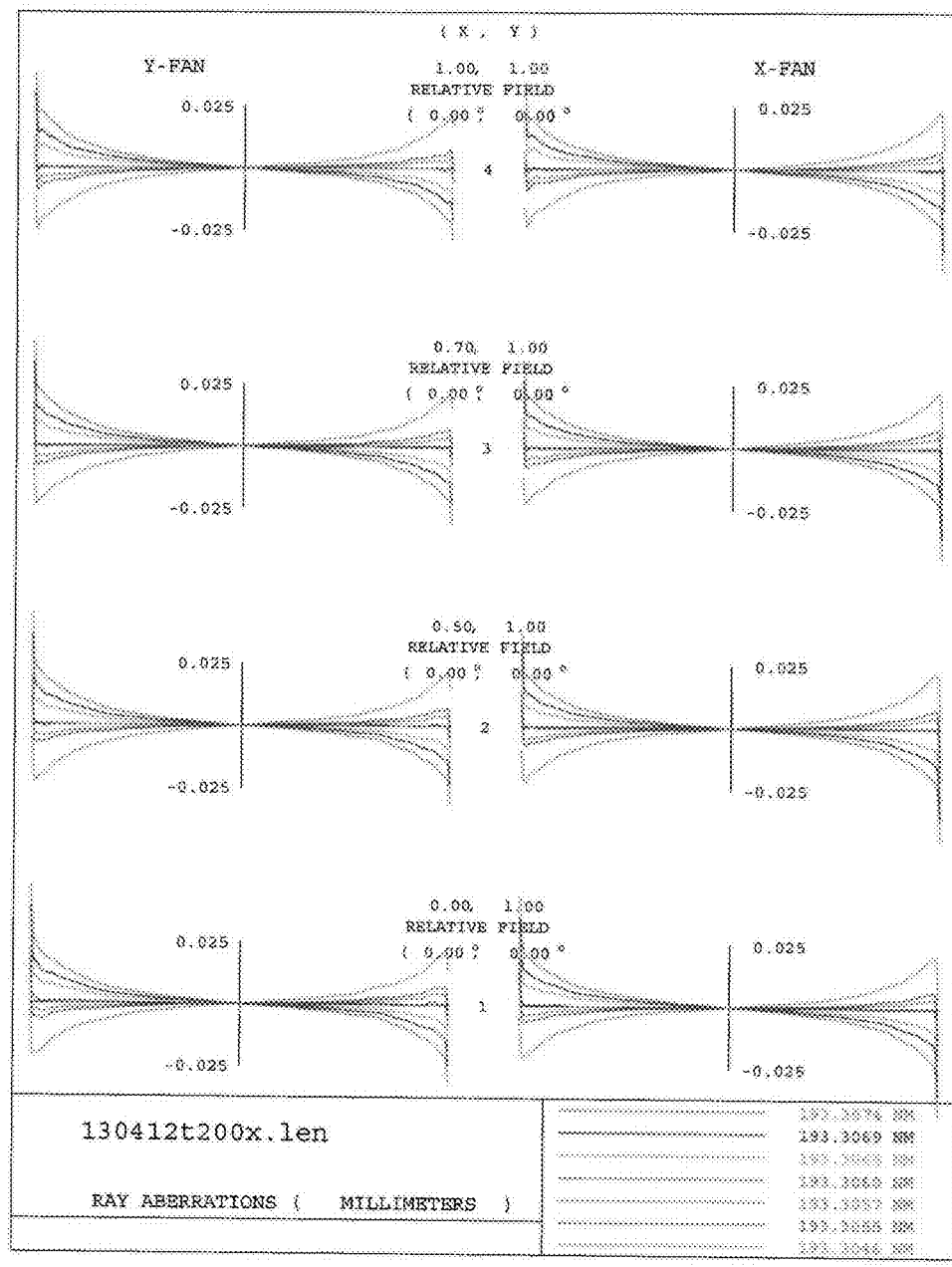
FIG. 7A shows plots representing ray aberrations, within a defined spectral bandwidth around the operating wavelength, at a plane of the SLM (element 24) of the embodiment of FIG. 3A.
Figure 7B:
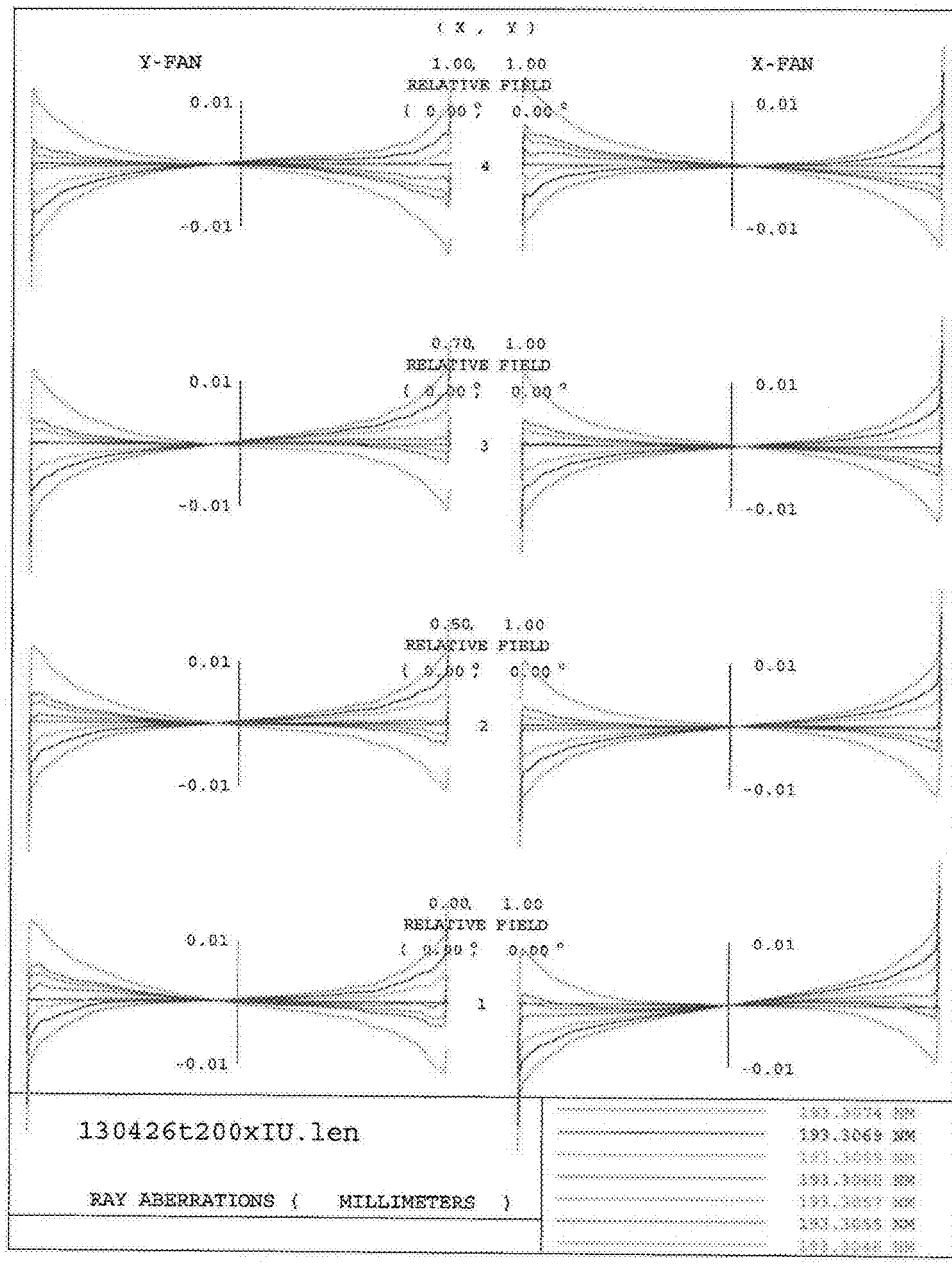
FIG. 7B shows plots representing ray aberrations, within a defined spectral bandwidth around the operating wavelength, in the image plane (wafer) of the embodiment of FIG. 3A.
Figure 8:
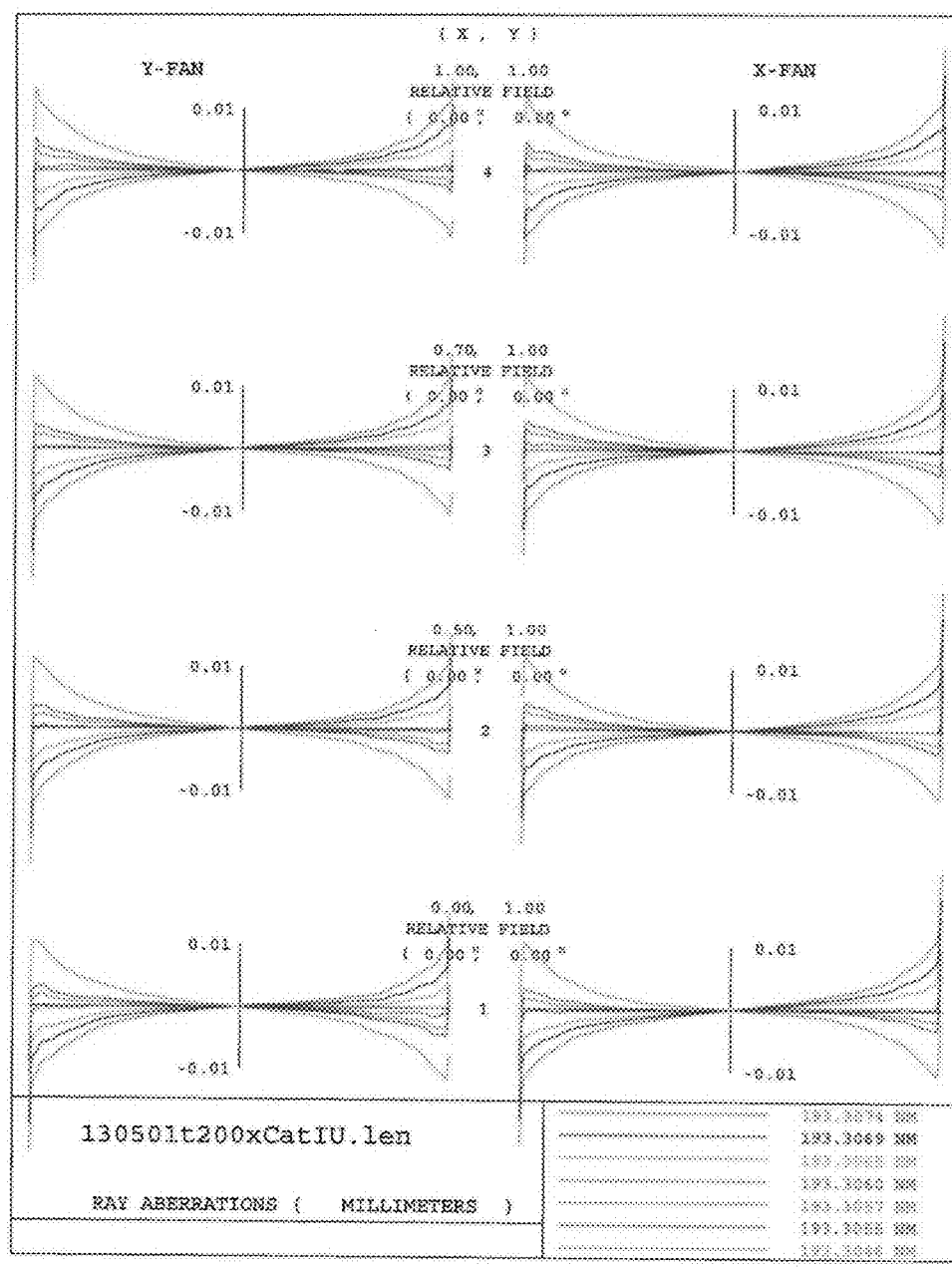
FIG. 8 shows plots representing ray aberrations, within a defined spectral bandwidth around the operating wavelength, in the image plane (wafer) of the embodiment of FIG. 4.

Descriptions of aberrations characterizing imaging through the catadioptric lens A of the embodiment 300 of the field framing plane 32 onto the surface of the wafer 1 are presented in FIG. 7A and Table 3B (addressing the ray aberrations, at wavelengths in an approximately 3 pm-wide spectral bandwidth centered at about 193.3 nm, at the plane of the SLM and wavefront aberrations associated with the imaging through the catadioptric lens A of the embodiment 300) and Table 3C (addressing the wavefront aberrations associated with the imaging through the overall optical system of the embodiment 300, between the field framing plane 32 and the surface of the wafer 1). FIG. 7B complements the data of FIG. 7A by providing lots of ray aberrations defined, for the embodiment of FIG. 3A, in the image plane (wafer) within a defined spectral bandwidth around the operating wavelengths. Descriptions of aberrations characterizing imaging through the overall optical system of the embodiment 400 of the invention, between the field framing plane 33 of the embodiment 400 and the surface of the wafer 1 of FIG. 4, are summarized in FIG. 8 and Table 4B (addressing the ray aberrations and wavefront aberrations, respectively). The direct comparison between the data on aberrations for the fully-catadioptric projection lens according to the idea of the invention with those for a conventional lens highlights the advantages of the embodiment of the invention.

As evidenced by the disclosed data, a person of skill in the art will readily appreciate that, for example, the field curvature of the fully-catadioptric design of the invention is substantially reduced compared to that of a conventionally-design system 300. Moreover, the difference between the figures of merits describing the polychromatic aberrations and those describing monochromatic aberrations is substantially smaller for the embodiment 400 of the invention as compared to the embodiment 300. Furthermore, the values of Strehl ratio across the field for the embodiment 400 of the invention are substantially higher than those for the embodiment 300 (see, for example, Strehl ratios respectively characterizing monochromatic rms wavefront aberrations). The embodiment of the invention ensures, in addition to operationally negligible distortion of imaging between the SLM and the wafer, very small residual monochromatic aberrations on the order of about 5 milliwaves rms or less.

It is worth noting that, by structuring the illumination relay of the overall projection system as a catadioptric sub-system, the chromatic aberrations of imaging are substantially reduced in the 50× to 200× dimension reduction system that employs only fused silica refractive optical elements and without the use of complex lenses employing 3 different materials (such as, for example, a classical doublet lens). The reduction of chromatic aberrations results in negligible loss of image contrast when an embodiment of the invention—as compared to a conventionally-designed dioptric-catadioptric projection system—when the system is used with a solid-state laser source the spectral bandwidth of which is on the order of 1 pm FWHM.

Accordingly, embodiments of the present invention provides maskless projection optical systems structured to enable imaging of an object pattern onto a semiconductor wafer with a de-magnification factor of at least 50× and as high as 200×. The projection optics comprises an illumination relay, which projects the UV light of about 193 nm from a field framing plane onto the SLM that reflects the incident light, and a projection lens through which the SLM-reflected UV light is further directed to a semiconductor substrate. The SLM is illuminated by non-telecentric off-axis illumination, and both the illumination relay and the projection lens include a catadioptric optical sub-system to advantageously reduce chromatic aberrations of the system operating in a spectral bandwidth on the order of 1 pm. A fluid is provided between the substrate and the last optical element of the projection lens. The projection optical systems of the invention are configured to enable imaging with an NA of 1.0 or higher.

Example of a Wafer Exposure Apparatus.

Figure 9:
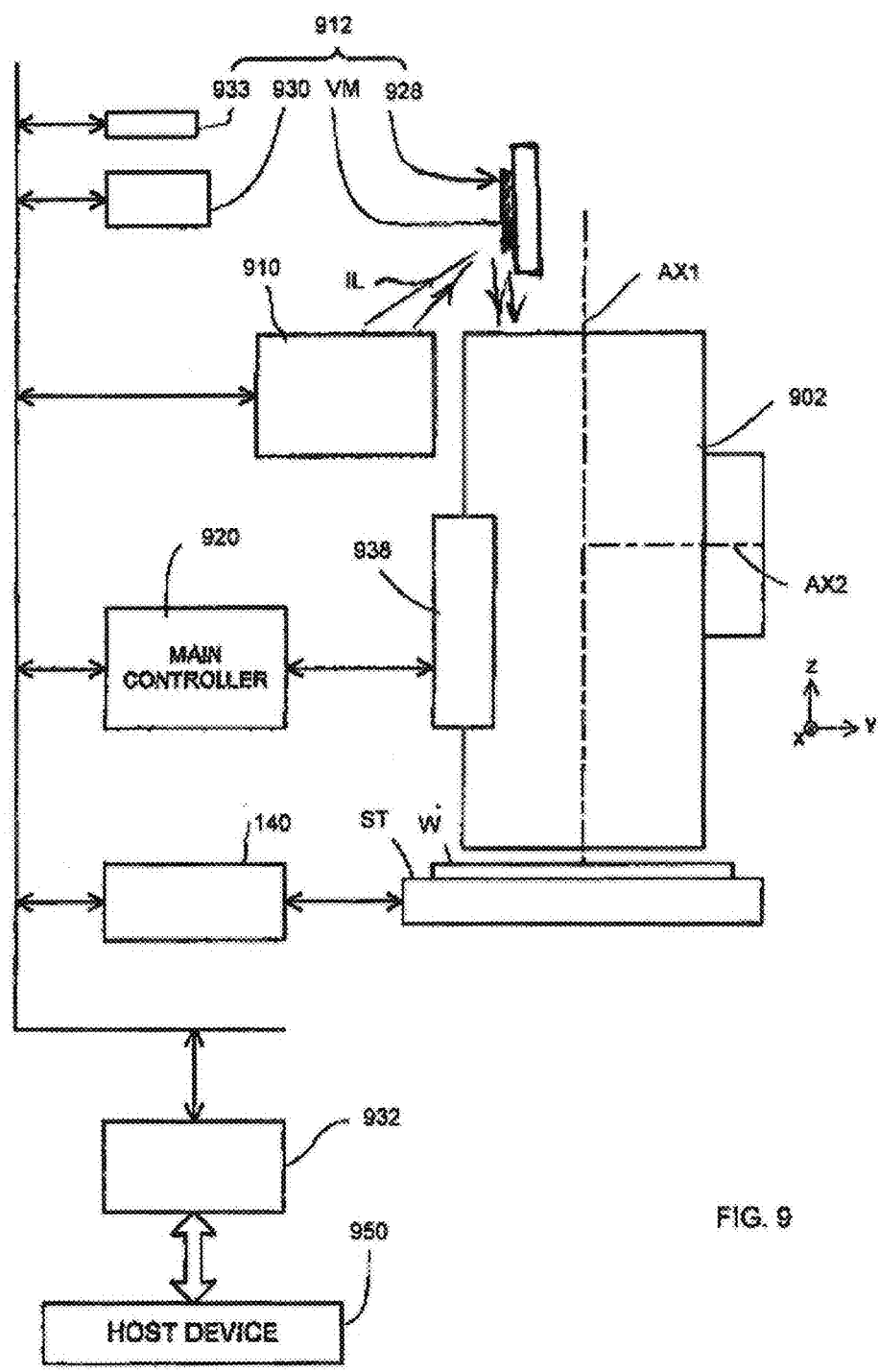
FIG. 9 is a schematic diagram illustrating a concept of an exposure device (digital scanner) utilizing an embodiment of the invention.

An embodiment 900 of the exposure apparatus utilizing an embodiment of the invention is shown in a diagram of FIG. 9, and is equipped with an illumination system 910, a pattern generation device 112, the fully-catadioptric imaging system 902 (such as, for example, an embodiment 200 or 400), a positioning stage device 916, an electronic circuitry governing these and other devices. FIG. 9 illustrates only a schematic of the embodiment, approximately indicating the operable cooperation among the components of the apparatus and not the precise position or orientation of such components, and is not to scale. The exposure apparatus 900 performs an exposure process by projecting an image of a pattern, which is generated by the pattern generation device 112, on a wafer plate (sensitive substrate) W mounted on a stage ST that constitutes a part of the stage device 916, via the catadioptric system of the invention 902, in a scanning fashion that includes synchronization of switching (changing) of a pattern generated by the pattern generation device 912 with movement of the wafer W. The wafer W is scanned in the xy-plane as indicated, with the SLM plane being perpendicular to the plane of the wafer. The exposure apparatus has a degree of freedom to change the angular orientation of the wafer W about the x, y, and z-axes.

The control system includes a data-collection and/or data-processing electronic circuitry (controller) 920 that may be part of a computer processor specifically programmed to govern the operation of the apparatus 900. The control system may be connected to a host device 950 via a communication interface 932.

The illumination system 910 delivers preferably spatially-uniform illumination of a variable molding mask VM, which constitutes a part of the pattern generation device 912, with an illumination (exposure)) UV-light IL, and is equipped with: a light source system including at least a UV-light source and a light source control system and an illumination condition-setting mechanism operable to change changing light irradiance distribution at the pupil plane of the illumination optical system; optionally a field stop, a relay lens, and other required zooming, polarizing optical elements as required, among which there may be present an optical integrator (a fly-eye lens), not shown.

The pattern generation device 912 is an electronic mask system that generates a variable pattern to be projected onto the waver W mounted on the stage ST, and is equipped with at least: the variable molding mask VM; a holder 928 that holds the variable molding mask VM; a drive system (controller) 930 that controls operation states of the variable molding mask VM; a tangible, non-transitory and optionally computer-readable memory 933. The mask variable molding mask may generally include a device containing a plurality of micro-reflectors such as, for example, a digital micromirror device, known as a DMD, or a 3D MEMS.

The variable molding mask VM is placed above (+Z side) the fully-catadioptric embodiment of the projection system 902, and the illumination light IL is delivered to the system 902 from the illumination system 110 upon reflection from the variable molding mask.

The drive system 930 acquires design data (such as CAD data) of a pattern, required for forming a pattern image on the wafer W, from the host device 950 via the interface 932. The drive system 930 further refers to data (hereinafter, called "signal generation information") stored in the memory 933, and generates signals to drive the elements/mirrors of the variable molding mask VM based on the design data acquired. The signals to drive each micro mirror are supplied to the driving mechanism of each micro mirror. The drive system 930 can vary patterns to be generated by the variable molding mask VM based on the design data acquired, which may be optionally effectuated synchronously with the movements of the wafer W P mounted on the stage ST.

In addition to the elements of the fully-catadioptric projections system 902 discussed above in reference to the embodiments of FIGS. 2A and 4, an image-forming property compensation device 938 (which drives particular elements inside the fully-catadioptric system 902 in the directions Ax1 AX2 and tilts them according to the provided degrees of angular freedom) may be arranged in operable communication with the system 902. The image-forming property compensation device 938 adjusts image-forming states of the fully catadioptric system 902 of the invention. Alternatively or in addition, wavelength properties of the illumination light IL (such as center of wavelength, spectral bandwidth, and the like) may be controlled to achieve the modification of the image on the wafer W.

The stage device 916 is equipped with: the stage ST that is movable while holding a wafer W (such as a glass substrate, a semiconductor wafer, for example) prepared for exposure; and a stage drive system 940 that controls the operational states (movement and the like) of the stage ST according to commands received from the main controller 920. Positional information (including rotation information) describing the orientation of the stage ST is measured by a positional measurement system (not shown) that may include, for example, a laser interferometer and/or encoder as well as a focus sensor, and is supplied to the main controller 920 which, in turn, drives motors of the stage drive system 940 based on such positional information.

TABLE 1A

Description of Optical Train of the Embodiment 100 of FIG. 1A.

| ELEMENT NUMBER | RADIUS OF CURVATURE FRONT | RADIUS OF CURVATURE BACK | THICKNESS | APERTURE DIAMETER FRONT | APERTURE DIAMETER BACK | GLASS |
|---|---|---|---|---|---|---|
| OBJECT | INF | | 3.0000 | | | 'Water' |
| 2 | INF | −16.2570 CX | 13.1558 | 20.2277 | 30.2121 | 'SiO2' |
| | | | 0.2869 | | | |
| 3 | S(1) | −39.7263 CX | 15.3707 | 46.7684 | 59.3550 | 'SiO2' |
| | | | 0.2869 | | | |
| 4 | S(2) | −60.2724 CX | 19.0464 | 76.1508 | 82.8331 | 'SiO2' |
| | | | APERTURE STOP | 82.8331 | | |
| | | | 0.2869 | | | |
| 5 | S(3) | −76.5071 CX | 18.2258 | 90.6356 | 96.6083 | 'SiO2' |
| | | | 0.5739 | | | |
| 6 | 359.3759 CX | S(4) | 23.0773 | 104.8449 | 106.5348 | 'SiO2' |
| | | | 37.1856 | | | |
| 7 | 308.2081 CX | −328.8230 CX | 26.5407 | 102.9433 | 99.8443 | 'SiO2' |
| | | | 12.2840 | | | |
| 8 | 89.4404 CX | 1362.2325 CC | 16.7807 | 87.4584 | 83.3926 | 'SiO2' |
| | | | 8.8213 | | | |
| 9 | S(5) | −487.6829 CX | 7.5000 | 81.5244 | 78.3413 | 'SiO2' |
| | | | 76.8018 | | | |
| 10 | 193.1846 CX | 71.5006 CC | 5.0000 | 38.8226 | 36.4073 | 'SiO2' |
| | | | 7.6993 | | | |
| 11 | −39.8835 CC | A(1) | 5.0000 | 36.1057 | 38.1009 | 'SiO2' |
| | | | 33.5985 | | | |
| 12 | 382.1002 CX | −77.5554 CX | 12.0926 | 53.9990 | 55.5152 | 'SiO2' |
| | | | 1.0000 | | | |
| 13 | 1310.5028 CX | A(2) | 8.5747 | 55.3320 | 55.1363 | 'SiO2' |
| | | | 50.0953 | | | |
| | DECENTER(1) | | | | | |
| 14 | INF | | −50.2113 | C-1 | | REFL |
| 15 | −524.0530 CX | A(3) | −13.2517 | 60.2578 | 61.4956 | |
| | | | −206.1572 | | | |
| 16 | 58.8481 CC | 115.4857 CX | −5.0000 | 69.6685 | 75.0749 | 'SiO2' |
| | | | −1.1717 | | | |
| 17 | A(4) | −113.4481 CC | −5.1648 | 76.6516 | 81.7457 | 'SiO2' |
| | | | −123.3907 | | | |
| 18 | 181.5965 CC | | 123.3907 | 185.8623 | | REFL |
| 19 | −113.4481 CC | A(5) | 5.1648 | 92.6117 | 88.5530 | |
| | | | 1.1717 | | | |
| 20 | 115.4857 CX | 58.8481 CC | 5.0000 | 86.0541 | 79.2534 | 'SiO2' |
| | | | 206.1572 | | | |
| 21 | A(6) | −524.0530 CX | 13.2517 | 93.7414 | 93.1676 | 'SiO2' |
| | | | 50.2113 | | | |
| | DECENTER(2) | | | | | |
| | | | | 88.5989 | | |
| | | | 49.9344 | | | |
| 22 | −128.3482 CC | 120.3731 CC | 14.6614 | 68.5771 | 69.6874 | 'SiO2' |
| | | | 107.6287 | | | |
| 23 | A(7) | −86.2586 CX | 11.8617 | 108.0913 | 112.2249 | 'SiO2' |
| | | | 502.2967 | | | |
| 24 | INF | | −100.0000 | 216.3994 | | REFL |
| | DECENTER(3) | | | | | |
| 25 | INF | | 100.0000 | C-2 | | REFL |
| 26 | 419.9816 CX | −714.1824 CX | 44.9407 | 282.2641 | 281.7818 | 'SiO2' |
| | | | 0.1000 | | | |
| 27 | 216.9230 CX | 167.2850 CC | 32.4700 | 261.3636 | 234.5263 | 'SiO2' |
| | | | 557.4266 | | | |
| | | | | 157.5295 | | |
| | | | 0.0000 | | | |
| | | | | 157.5295 | | |
| | | | 295.3348 | | | |
| 28 | 127.1564 CX | −23012.2683 CX | 51.4661 | 112.2159 | 95.5665 | 'SiO2' |
| | | | 95.5116 | | | |
| 29 | −72.8237 CC | 84.6697 CC | 11.0413 | 32.0499 | 30.0404 | 'SiO2' |
| | | | 27.3428 | | | |

TABLE 1A-continued

Description of Optical Train of the Embodiment 100 of FIG. 1A.

| | | | | | | |
|---|---|---|---|---|---|---|
| 30 | 595.1633 CX | −94.4057 CX | 76.1582<br>341.1608 | 42.0182 | 68.6892 | 'SiO2' |
| 31 | 202.9635 CX | −702.1241 CX | 35.0000<br>0.6118 | 136.2980 | 133.6332 | 'SiO2' |
| 32 | 99.8742 CX | 80.2315 CC | 8.0304<br>123.4048 | 125.3481 | 117.0218 | 'SiO2' |
| IMAGE | IMAGE DISTANCE =<br>INF | | | | 108.1814 | |

APERTURE DATA

| | | DIAMETER | | DECENTER | | |
|---|---|---|---|---|---|---|
| APERTURE | SHAPE | X | Y | X | Y | ROTATION |
| C-1 | RECTANGLE | 52.482 | 20.000 | 0.000 | 25.000 | 0.0 |
| C-2 | RECTANGLE | 307.113 | 40.000 | 0.000 | −110.000 | 0.0 | aspheric constants $$Z = \frac{(CURV)Y^2}{1 + (1 - (1+K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| ASPHERIC | CURV | K<br>E | A<br>F | B<br>G | C<br>H | D<br>J |
|---|---|---|---|---|---|---|
| A(1) | 0.851039E−02 | 0.00000000<br>−2.32923E−18 | −1.01624E−06<br>2.08999E−21 | 6.08007E−10<br>0.00000E+00 | −5.62736E−13<br>0.00000E+00 | 1.14084E−15<br>0.00000E+00 |
| A(2) | −0.618726E−02 | 0.00000000<br>0.00000E+00 | 1.39355E−07<br>0.00000E+00 | 1.13165E−11<br>0.00000E+00 | 7.81414E−16<br>0.00000E+00 | 5.66581E−19<br>0.00000E+00 |
| A(3) | 0.518760E−02 | 0.00000000<br>0.00000E+00 | −8.99477E−08<br>0.00000E+00 | −2.67713E−12<br>0.00000E+00 | −8.56400E−16<br>0.00000E+00 | 7.98734E−20<br>0.00000E+00 |
| A(4) | 0.01015569 | 0.00000000<br>8.17140E−21 | −1.65154E−06<br>−4.67186E−25 | −2.76782E−10<br>0.00000E+00 | 1.94297E−13<br>0.00000E+00 | −5.45936E−17<br>0.00000E+00 |
| A(5) | 0.01015569 | 0.00000000<br>8.17140E−21 | −1.65154E−06<br>−4.67186E−25 | −2.76782E−10<br>0.00000E+00 | 1.94297E−13<br>0.00000E+00 | −5.45936E−17<br>0.00000E+00 |
| A(6) | 0.518760E−02 | 0.00000000<br>0.00000E+00 | −8.99477E−08<br>0.00000E+00 | −2.67713E−12<br>0.00000E+00 | −8.56400E−16<br>0.00000E+00 | 7.98734E−20<br>0.00000E+00 |
| A(7) | −0.960266E−02 | 0.00000000<br>0.00000E+00 | 2.22077E−08<br>0.00000E+00 | 1.44665E−12<br>0.00000E+00 | 1.43851E−16<br>0.00000E+00 | 1.09803E−20<br>0.00000E+00 |

SPECIAL SURFACES (SPS types)
QCN SURFACES
x = (Y/NRADIUS)**2

$$Z = \frac{(CURV)Y^2}{1 + (1 - (1+K)(CURV)^2 Y^2)^{1/2}} + x^2 * \left( (QC4) Q_0^{con}(x) + (QC6) Q_1^{con}(x) + \ldots + (QC30) Q_{13}^{con}(x) \right)$$

| ASPHERIC | CURV | NRADIUS (C2)<br>QC10 (C7)<br>QC20 (C12)<br>QC30 (C17) | K (C1)<br>QC12 (C8)<br>QC22 (C13) | QC4 (C4)<br>QC14 (C9)<br>QC24 (C14) | QC6 (C5)<br>QC16 (C10)<br>QC26 (C15) | QC8 (C6)<br>QC18 (C11)<br>QC28 (C16) |
|---|---|---|---|---|---|---|
| S(1) | −0.193296E−01 | 0.241104E+02<br>0.409086E−02<br>−0.131607E−04<br>−0.437373E−06 | 0.000000E+00<br>−0.809714E−03<br>−0.914150E−06 | 0.102350E+01<br>0.125654E−03<br>−0.301755E−05 | −0.110831E+00<br>−0.792809E−04<br>−0.558949E−06 | −0.153148E−01<br>0.106091E−04<br>−0.106807E−05 |

| ASPHERIC | CURV | NRADIUS (C2)<br>QC10 (C7)<br>QC20 (C12)<br>QC30 (C17) | K (C1)<br>QC12 (C8)<br>QC22 (C13) | QC4 (C4)<br>QC14 (C9)<br>QC24 (C14) | QC6 (C5)<br>QC16 (C10)<br>QC26 (C15) | QC8 (C6)<br>QC18 (C11)<br>QC28 (C16) |
|---|---|---|---|---|---|---|
| S(2) | −0.549169E−02 | 0.410514E+02<br>−0.563430E−01<br>−0.416675E−03<br>0.192168E−06 | 0.000000E+00<br>−0.119113E−01<br>−0.202108E−03 | 0.647857E+00<br>−0.815318E−02<br>−0.522481E−04 | −0.579468E−01<br>−0.237721E−02<br>−0.187957E−04 | −0.149522E+00<br>−0.153527E−02<br>−0.238197E−06 |

| ASPHERIC | CURV | NRADIUS (C2)<br>QC10 (C7)<br>QC20 (C12)<br>QC30 (C17) | K (C1)<br>QC12 (C8)<br>QC22 (C13) | QC4 (C4)<br>QC14 (C9)<br>QC24 (C14) | QC6 (C5)<br>QC16 (C10)<br>QC26 (C15) | QC8 (C6)<br>QC18 (C11)<br>QC28 (C16) |
|---|---|---|---|---|---|---|
| S(3) | −0.611446E−02 | 0.480523E+02<br>0.884384E−01<br>0.393635E−03<br>0.577816E−05 | 0.000000E+00<br>0.160688E−01<br>0.615198E−03 | 0.212139E−01<br>−0.316193E−02<br>0.360576E−03 | −0.640452E+00<br>−0.469821E−02<br>0.142886E−03 | 0.290637E+00<br>−0.111522E−02<br>0.388167E−04 |

TABLE 1A-continued

Description of Optical Train of the Embodiment 100 of FIG. 1A.

| ASPHERIC | CURV | NRADIUS (C2) QC10 (C7) QC20 (C12) QC30 (C17) | K (C1) QC12 (C8) QC22 (C13) | QC4 (C4) QC14 (C9) QC24 (C14) | QC6 (C5) QC16 (C10) QC26 (C15) | QC8 (C6) QC18 (C11) QC28 (C16) |
|---|---|---|---|---|---|---|
| S(4) | −0.379826E−02 | 0.559469E+02 0.581555E−01 0.915187E−03 0.406977E−05 | 0.000000E+00 0.175100E−01 0.409889E−03 | −0.123020E+01 0.874534E−02 0.169900E−03 | −0.577347E−01 0.409713E−02 0.634141E−04 | 0.143110E+00 0.198654E−02 0.198459E−04 |

| ASPHERIC | CURV | NRADIUS (C2) QC10 (C7) QC20 (C12) QC30 (C17) | K (C1) QC12 (C8) QC22 (C13) | QC4 (C4) QC14 (C9) QC24 (C14) | QC6 (C5) QC16 (C10) QC26 (C15) | QC8 (C6) QC18 (C11) QC28 (C16) |
|---|---|---|---|---|---|---|
| S(5) | −0.546127E−02 | 0.430941E+02 0.358234E−02 −0.193417E−04 0.335430E−07 | 0.000000E+00 0.144329E−02 −0.133179E−04 | −0.234582E+01 0.459955E−03 −0.696762E−05 | −0.409559E−01 0.919185E−04 −0.262871E−05 | 0.130732E−02 −0.551606E−05 −0.709265E−06 |

DECENTERING CONSTANTS

| DECENTER | X | Y | Z | ALPHA | BETA | GAMMA | |
|---|---|---|---|---|---|---|---|
| D(1) | 0.0000 | 0.0000 | 0.0000 | 45.0000 | 0.0000 | 0.0000 | (BEND) |
| D(2) | 0.0000 | 0.0000 | 0.0000 | 45.0000 | 0.0000 | 0.0000 | (RETU) |
| D(3) | 0.0000 | 0.0000 | 0.0000 | −45.0000 | 0.0000 | 0.0000 | (BEND) |

TABLE 1B

Monochromatic and Polychromatic Wavefront Aberrations and Corresponding Strehl Ratios of the Catadioptric Projection Lens (I, II) of the Embodiment 100 of FIG. 1A.

| | | | BEST INDIVIDUAL FOCUS | | | | BEST COMPOSITE FOCUS | | | |
|---|---|---|---|---|---|---|---|---|---|---|
| FIELD | FRACT | DEG | SHIFT (MM.) | FOCUS (MM.) | RMS (WAVES) | STREHL | SHIFT (MM.) | FOCUS (MM.) | RMS (WAVES) | STREHL |
| Monochromatic rms wavefront aberrations and Strehl ratio - Wafer to SLM: | | | | | | | | | | |
| X | 0.00 | 0.00 | 0.000000 | 0.002182 | 0.0049 | 0.999 | 0.000000 | 0.000635 | 0.0050 | 0.999 |
| Y | 1.00 | 0.00 | −0.000058 | | | | 0.000048 | | | |
| X | 0.50 | 0.00 | 0.000124 | 0.002561 | 0.0050 | 0.999 | 0.000025 | 0.000635 | 0.0051 | 0.999 |
| Y | 1.00 | 0.00 | −0.000165 | | | | −0.000033 | | | |
| X | 0.70 | 0.00 | −0.000296 | −0.003506 | 0.0027 | 1.000 | 0.000003 | 0.000635 | 0.0036 | 1.000 |
| Y | 1.00 | 0.00 | 0.000282 | | | | −0.000003 | | | |
| X | 1.00 | 0.00 | 0.000065 | 0.001322 | 0.0032 | 1.000 | −0.000005 | 0.000635 | 0.0032 | 1.000 |
| Y | 1.00 | 0.00 | −0.000044 | | | | 0.000003 | | | |
| | | | | | | | COMPOSITE RMS FOR POSITION 1: | | 0.00432 | |
| Polychromatic rms wavefront aberrations and Strehl ratio - Wafer to SLM: Reduction in Strehl ratio between monochromatic and polychromatic cases represents the contrast loss from chromatic aberrations over the spectral band WL = 193.3074 193.3069 193.3065 193.306 193.3057 193.3055 193.3046 WTW = 11 29 60 100 69 17 5 | | | | | | | | | | |
| X | 0.00 | 0.00 | 0.000000 | 0.011497 | 0.0206 | 0.983 | 0.000000 | 0.009940 | 0.0206 | 0.983 |
| Y | 1.00 | 0.00 | −0.000054 | | | | 0.000053 | | | |
| X | 0.50 | 0.00 | 0.000121 | 0.011864 | 0.0207 | 0.983 | 0.000022 | 0.009940 | 0.0207 | 0.983 |
| Y | 1.00 | 0.00 | −0.000161 | | | | −0.000029 | | | |
| X | 0.70 | 0.00 | −0.000300 | 0.005790 | 0.0204 | 0.984 | −0.000001 | 0.009940 | 0.0205 | 0.984 |
| Y | 1.00 | 0.00 | 0.000286 | | | | 0.000001 | | | |
| X | 1.00 | 0.00 | 0.000063 | 0.010627 | 0.0206 | 0.983 | −0.000007 | 0.009940 | 0.0206 | 0.983 |
| Y | 1.00 | 0.00 | −0.000042 | | | | 0.000005 | | | |
| | | | | | | | COMPOSITE RMS FOR POSITION 1: | | 0.02060 | |

TABLE 1C

Monochromatic and Polychromatic Wavefront Aberrations and Corresponding Strehl Ratios of the Overall Embodiment 100 of FIG. 1A.

| | | | BEST INDIVIDUAL FOCUS | | | | BEST COMPOSITE FOCUS | | | |
|---|---|---|---|---|---|---|---|---|---|---|
| FIELD | FRACT | DEG | SHIFT (MM.) | FOCUS (MM.) | RMS (WAVES) | STREHL | SHIFT (MM.) | FOCUS (MM.) | RMS (WAVES) | STREHL |
| Monochromatic rms wavefront aberrations and Strehl ratio - Wafer to field framing plane: Variation in best individual focus shows the residual field curvature. WL = 193.3074 193.3069 193.3065 193.306 193.3057 193.3055 193.3046 WTW = 0 0 0 1 0 0 0 | | | | | | | | | | |
| X | 0.00 | 0.00 | 0.000000 | 0.022771 | 0.0803 | 0.775 | 0.000000 | −0.007150 | 0.1047 | 0.648 |
| Y | 1.00 | 0.00 | 0.000621 | | | | 0.000531 | | | |
| X | 0.50 | 0.00 | −0.000104 | −0.015071 | 0.0646 | 0.848 | −0.000101 | −0.007150 | 0.0670 | 0.838 |
| Y | 1.00 | 0.00 | 0.000133 | | | | 0.000155 | | | |
| X | 0.70 | 0.00 | 0.000071 | −0.043989 | 0.0323 | 0.960 | 0.000088 | −0.007150 | 0.0877 | 0.738 |
| Y | 1.00 | 0.00 | −0.000050 | | | | 0.000044 | | | |
| X | 1.00 | 0.00 | 0.000823 | 0.007510 | 0.0866 | 0.744 | 0.000816 | −0.007150 | 0.0923 | 0.714 |
| Y | 1.00 | 0.00 | −0.000533 | | | | −0.000579 | | | |
| | | | | | | | COMPOSITE RMS FOR POSITION 1: | | 0.08903 | |
| Polychromatic rms wavefront aberrations and Strehl ratio - Wafer to field framing plane: Reduction in Strehl ratio between monochromatic and polychromatic cases represents the contrast loss from chromatic aberrations over the spectral band. Variation in best individual focus shows the residual field curvature. WL = 193.3074 193.3069 193.3065 193.306 193.3057 193.3055 193.3046 WTW = 11 29 60 100 69 17 5 | | | | | | | | | | |
| X | 0.00 | 0.00 | 0.000000 | 0.025445 | 0.0844 | 0.755 | 0.000000 | −0.004468 | 0.1079 | 0.632 |
| Y | 1.00 | 0.00 | 0.000606 | | | | 0.000516 | | | |
| X | 0.50 | 0.00 | −0.000096 | −0.012416 | 0.0700 | 0.824 | −0.000094 | −0.004468 | 0.0722 | 0.814 |
| Y | 1.00 | 0.00 | 0.000118 | | | | 0.000140 | | | |
| X | 0.70 | 0.00 | 0.000081 | −0.041317 | 0.0418 | 0.933 | 0.000098 | −0.004468 | 0.0916 | 0.718 |
| Y | 1.00 | 0.00 | −0.000064 | | | | 0.000030 | | | |
| X | 1.00 | 0.00 | 0.000833 | 0.010241 | 0.0902 | 0.725 | 0.000827 | −0.004468 | 0.0958 | 0.696 |
| Y | 1.00 | 0.00 | −0.000544 | | | | −0.000590 | | | |
| | | | | | | | COMPOSITE RMS FOR POSITION 1: | | 0.09281 | |

TABLE 2A

Description of Optical Train of the Embodiment 200 of FIG. 2A.

| ELEMENT NUMBER | RADIUS OF CURVATURE | | THICKNESS | APERTURE DIAMETER | | GLASS |
|---|---|---|---|---|---|---|
| | FRONT | BACK | | FRONT | BACK | |
| OBJECT | INF | INF | 3.0000 | | | 'Water' |
| 2 | INF | −16.2570 CX | 13.1558 0.2869 | 20.2277 | 30.2121 | 'SiO2' |
| 3 | S(1) | −39.7263 CX | 15.3707 0.2869 | 46.7684 | 59.3550 | 'SiO2' |
| 4 | S(2) | −60.2724 CX | 19.0464 APERTURE STOP 0.2869 | 76.1508 | 82.8331 −82.8331 | 'SiO2' |
| 5 | S(3) | −76.5071 CX | 18.2258 0.5739 | 90.6356 | 96.6083 | 'SiO2' |
| 6 | 359.3759 CX | S(4) | 23.0773 37.1856 | 104.8449 | 106.5348 | 'SiO2' |
| 7 | 308.2081 CX | −328.8230 CX | 26.5407 12.2840 | 102.9433 | 99.8443 | 'SiO2' |
| 8 | 89.4404 CX | 1362.2325 CC | 16.7807 8.8213 | 87.4584 | 83.3926 | 'SiO2' |
| 9 | S(5) | −487.6829 CX | 7.5000 76.8018 | 81.5244 | 78.3413 | 'SiO2' |
| 10 | 193.1846 CX | 71.5006 CC | 5.0000 7.6993 | 38.8226 | 36.4073 | 'SiO2' |
| 11 | −39.8835 CC | A(1) | 5.0000 33.5985 | 36.1057 | 38.1009 | 'SiO2' |
| 12 | 382.1002 CX | −77.5554 CX | 12.0926 1.0000 | 53.9990 | 55.5152 | 'SiO2' |

TABLE 2A-continued

Description of Optical Train of the Embodiment 200 of FIG. 2A.

| | | | | | | |
|---|---|---|---|---|---|---|
| 13 | 1310.5028 CX | A(2) | 8.5747 | 55.3320 | 55.1363 | 'SiO2' |
| | | | 50.0953 | | | |
| | DECENTER(1) | | | | | |
| 14 | INF | | −50.2113 | | C-1 | REFL |
| 15 | −524.0530 CX | A(3) | −13.2517 | 60.2578 | 61.4956 | |
| | | | −206.1572 | | | |
| 16 | 58.8481 CC | 115.4857 CX | −5.0000 | 69.6685 | 75.0749 | 'SiO2' |
| | | | −1.1717 | | | |
| 17 | A(4) | −113.4481 CC | −5.1648 | 76.6516 | 81.7457 | 'SiO2' |
| | | | −123.3907 | | | |
| 18 | 181.5965 CC | | 123.3907 | 185.8623 | | REFL |
| 19 | −113.4481 CC | A(5) | 5.1648 | 92.6117 | 88.5530 | 'SiO2' |
| | | | 1.1717 | | | |
| 20 | 115.4857 CX | 58.8481 CC | 5.0000 | 86.0541 | 79.2534 | 'SiO2' |
| | | | 206.1572 | | | |
| 21 | A(6) | −524.0530 CX | 13.2517 | 93.7414 | 93.1676 | 'SiO2' |
| | | | 50.2113 | | | |
| | DECENTER( 2) | | | | 88.5989 | |
| | | | 49.9344 | | | |
| 22 | −128.3482 CC | 120.3731 CC | 14.6614 | 68.5771 | 69.6874 | 'SiO2' |
| | | | 107.6287 | | | |
| 23 | A(7) | −86.2586 CX | 11.8617 | 108.0913 | 112.2249 | 'SiO2' |
| | | | 502.2967 | | | |
| 24 | INF | | −160.0000 | 216.3994 | | REFL |
| | DECENTER(3) | | | | | |
| 25 | INF | | 145.0000 | | C-2 | REFL |
| 26 | 634.1614 CX | −481.4042 CX | 60.0000 | 311.6549 | 311.6673 | 'SiO2' |
| | | | 214.8823 | | | |
| 27 | −253.8821 CC | −610.0222 CX | 25.0000 | 225.1467 | 229.7226 | 'SiO2' |
| | | | 153.1720 | | | |
| | DECENTER(4) | | | | | |
| 28 | INF | | −200.0000 | | C-3 | REFL |
| 29 | 823.1657 CC | | 353.5057 | 216.5542 | | REFL |
| 30 | 103.1957 CX | 77.5662 CC | 25.0000 | 27.3671 | 31.8654 | 'SiO2' |
| | | | 145.7979 | | | |
| 31 | −1301.3477 CC | −176.7716 CX | 40.0000 | 115.2141 | 127.1097 | 'SiO2' |
| | | | 0.1000 | | | |
| 32 | 226.1976 CX | −533.9956 CX | 35.0000 | 131.6026 | 129.7346 | 'SiO2' |
| | | | 0.1000 | | | |
| 33 | 96.8063 CX | 80.2315 CC | 8.0304 | 122.5221 | 114.9970 | 'SiO2' |
| | IMAGE DISTANCE = | | 100.0031 | | | |
| IMAGE | INF | | | 108.1987 | | |

APERTURE DATA

| APERTURE | SHAPE | DIAMETER | | DECENTER | | ROTATION |
|---|---|---|---|---|---|---|
| | | X | Y | X | Y | |
| C-1 | RECTANGLE | 52.482 | 20.000 | 0.000 | 25.000 | 0.0 |
| C-2 | RECTANGLE | 329.531 | 50.000 | 0.000 | −120.000 | 0.0 |
| C-3 | RECTANGLE | 259.931 | 50.000 | 0.000 | −80.000 | 0.0 | aspheric constants $$Z = \frac{(CURV)Y^2}{1 + (1 - (1 + K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| ASPHERIC | CURV | K | A | B | C | D |
|---|---|---|---|---|---|---|
| | | E | F | G | H | J |
| A(1) | 0.851039E−02 | 0.00000000 | −1.01624E−06 | 6.08007E−10 | −5.62736E−13 | 1.14084E−15 |
| | | −2.32923E−18 | 2.08999E−21 | 0.00000E+00 | 0.00000E+00 | 0.00000E+00 |
| A(2) | −0.618726E−02 | 0.00000000 | 1.39355E−07 | 1.13165E−11 | 7.81414E−16 | 5.66581E−19 |
| | | 0.00000E+00 | 0.00000E+00 | 0.00000E+00 | 0.00000E+00 | 0.00000E+00 |
| A(3) | 0.518760E−02 | 0.00000000 | −8.99477E−08 | −2.67713E−12 | −8.56400E−16 | 7.98734E−20 |
| | | 0.00000E+00 | 0.00000E+00 | 0.00000E+00 | 0.00000E+00 | 0.00000E+00 |
| A(4) | 0.01015569 | 0.00000000 | −1.65154E−06 | −2.76782E−10 | 1.94297E−13 | −5.45936E−17 |
| | | 8.17140E−21 | −4.67186E−25 | 0.00000E+00 | 0.00000E+00 | 0.00000E+00 |
| A(5) | 0.01015569 | 0.00000000 | −1.65154E−06 | −2.76782E−10 | 1.94297E−13 | −5.45936E−17 |
| | | 8.17140E−21 | −4.67186E−25 | 0.00000E+00 | 0.00000E+00 | 0.00000E+00 |
| A(6) | 0.518760E−02 | 0.00000000 | −8.99477E−08 | −2.67713E−12 | −8.56400E−16 | 7.98734E−20 |
| | | 0.00000E+00 | 0.00000E+00 | 0.00000E+00 | 0.00000E+00 | 0.00000E+00 |
| A(7) | −0.960266E−02 | 0.00000000 | 2.22077E−08 | 1.44665E−12 | 1.43851E−16 | 1.09803E−20 |
| | | 0.00000E+00 | 0.00000E+00 | 0.00000E+00 | 0.00000E+00 | 0.00000E+00 |

TABLE 2A-continued

Description of Optical Train of the Embodiment 200 of FIG. 2A.

SPECIAL SURFACES (SPS types)
QCN SURFACES
x = (Y/NRADIUS)**2

$$Z = \frac{(CURV)Y^2}{1 + (1 - (1 + K)(CURV)^2 Y^2)^{1/2}} + x^2 * \left( (QC4) \overset{con}{Q}_0 (x) + (QC6) \overset{con}{Q}_1 (x) + \ldots + (QC30) \overset{con}{Q}_{13} (x) \right)$$

| ASPHERIC | CURV | NRADIUS (C2) | K (C1) | QC4 (C4) | QC6 (C5) | QC8 (C6) |
|---|---|---|---|---|---|---|
| | | QC10 (C7) | QC12 (C8) | QC14 (C9) | QC16 (C10) | QC18 (C11) |
| | | QC20 (C12) | QC22 (C13) | QC24 (C14) | QC26 (C15) | QC28 (C16) |
| | | QC30 (C17) | | | | |
| S(1) | −0.193296E−01 | 0.241104E+02 | 0.000000E+00 | 0.102350E+01 | −0.110831E+00 | −0.153148E−01 |
| | | 0.409086E−02 | −0.809714E−03 | 0.125654E−03 | −0.792809E−04 | 0.106091E−04 |
| | | −0.131607E−04 | −0.914150E−06 | −0.301755E−05 | −0.558949E−06 | −0.106807E−05 |
| | | −0.437373E−06 | | | | |

| ASPHERIC | CURV | NRADIUS (C2) | K (C1) | QC4 (C4) | QC6 (C5) | QC8 (C6) |
|---|---|---|---|---|---|---|
| | | QC10 (C7) | QC12 (C8) | QC14 (C9) | QC16 (C10) | QC18 (C11) |
| | | QC20 (C12) | QC22 (C13) | QC24 (C14) | QC26 (C15) | QC28 (C16) |
| | | QC30 (C17) | | | | |
| S(2) | −0.549169E−02 | 0.410514E+02 | 0.000000E+00 | 0.647857E+00 | −0.579468E−01 | −0.149522E+00 |
| | | −0.563430E−01 | −0.119113E−01 | −0.815318E−02 | −0.237721E−02 | −0.153527E−02 |
| | | −0.416675E−03 | −0.202108E−03 | −0.522481E−04 | −0.187957E−04 | −0.238197E−06 |
| | | 0.192168E−06 | | | | |

| ASPHERIC | CURV | NRADIUS (C2) | K (C1) | QC4 (C4) | QC6 (C5) | QC8 (C6) |
|---|---|---|---|---|---|---|
| | | QC10 (C7) | QC12 (C8) | QC14 (C9) | QC16 (C10) | QC18 (C11) |
| | | QC20 (C12) | QC22 (C13) | QC24 (C14) | QC26 (C15) | QC28 (C16) |
| | | QC30 (C17) | | | | |
| S(3) | −0.611446E−02 | 0.480523E+02 | 0.000000E+00 | 0.212139E−01 | −0.640452E+00 | 0.290637E+00 |
| | | 0.884384E−01 | 0.160688E−01 | −0.316193E−02 | −0.469821E−02 | −0.111522E−02 |
| | | 0.393635E−03 | 0.615198E−03 | 0.360576E−03 | 0.142886E−03 | 0.388167E−04 |
| | | 0.577816E−05 | | | | |

| ASPHERIC | CURV | NRADIUS (C2) | K (C1) | QC4 (C4) | QC6 (C5) | QC8 (C6) |
|---|---|---|---|---|---|---|
| | | QC10 (C7) | QC12 (C8) | QC14 (C9) | QC16 (C10) | QC18 (C11) |
| | | QC20 (C12) | QC22 (C13) | QC24 (C14) | QC26 (C15) | QC28 (C16) |
| | | QC30 (C17) | | | | |
| S(4) | −0.379826E−02 | 0.559469E+02 | 0.000000E+00 | −0.123020E+01 | −0.577347E−01 | 0.143110E+00 |
| | | 0.581555E−01 | 0.175100E−01 | 0.874534E−02 | 0.409713E−02 | 0.198654E−02 |
| | | 0.915187E−03 | 0.409889E−03 | 0.169900E−03 | 0.634141E−04 | 0.198459E−04 |
| | | 0.406977E−05 | | | | |

| ASPHERIC | CURV | NRADIUS (C2) | K (C1) | QC4 (C4) | QC6 (C5) | QC8 (C6) |
|---|---|---|---|---|---|---|
| | | QC10 (C7) | QC12 (C8) | QC14 (C9) | QC16 (C10) | QC18 (C11) |
| | | QC20 (C12) | QC22 (C13) | QC24 (C14) | QC26 (C15) | QC28 (C16) |
| | | QC30 (C17) | | | | |
| S(5) | −0.546127E−02 | 0.430941E+02 | 0.000000E+00 | −0.234582E+01 | −0.409559E−01 | 0.130732E−02 |
| | | 0.358234E−02 | 0.144329E−02 | 0.459955E−03 | 0.919185E−04 | −0.551606E−05 |
| | | −0.193417E−04 | −0.133179E−04 | −0.696762E−05 | −0.262871E−05 | −0.709265E−06 |
| | | 0.335430E−07 | | | | |

DECENTERING CONSTANTS

| DECENTER | X | Y | Z | ALPHA | BETA | GAMMA | |
|---|---|---|---|---|---|---|---|
| D(1) | 0.0000 | 0.0000 | 0.0000 | 45.0000 | 0.0000 | 0.0000 | (BEND) |
| D(2) | 0.0000 | 0.0000 | 0.0000 | 45.0000 | 0.0000 | 0.0000 | (RETU) |
| D(3) | 0.0000 | 0.0000 | 0.0000 | −45.0000 | 0.0000 | 0.0000 | (BEND) |
| D(4) | 0.0000 | 0.0000 | 0.0000 | −45.0000 | 0.0000 | 0.0000 | (BEND) |

TABLE 2B

Monochromatic and Polychromatic Wavefront Aberrations and Corresponding Strehl Ratios of the Overall Embodiment 200 of FIG. 2A.

| | | | BEST INDIVIDUAL FOCUS | | | | BEST COMPOSITE FOCUS | | | |
|---|---|---|---|---|---|---|---|---|---|---|
| FIELD | FRACT | DEG | SHIFT (MM.) | FOCUS (MM.) | RMS (WAVES) | STREHL | SHIFT (MM.) | FOCUS (MM.) | RMS (WAVES) | STREHL |

Monochromatic rms wavefront aberrations and Strehl ratio - Wafer to field framing plane:
Variation in best individual focus shows the residual field curvature -
much reduced when compared with Dioptric design
WL = 193.3074 193.3069 193.3065 193.306 193.3057 193.3055 193.3046
WTW = 0 0 0 1 0 0 0

| X | 0.00 | 0.00 | 0.000000 | 0.005621 | 0.0627 | 0.856 | 0.000000 | 0.000129 | 0.0639 | 0.851 |
| Y | 1.00 | 0.00 | 0.000108 | | | | 0.000092 | | | |
| X | 0.50 | 0.00 | 0.000010 | −0.006715 | 0.0254 | 0.975 | 0.000012 | 0.000129 | 0.0297 | 0.966 |
| Y | 1.00 | 0.00 | 0.000071 | | | | 0.000091 | | | |
| X | 0.70 | 0.00 | 0.000110 | −0.001322 | 0.0548 | 0.888 | 0.000110 | 0.000129 | 0.0549 | 0.888 |
| Y | 1.00 | 0.00 | −0.000075 | | | | −0.000071 | | | |
| X | 1.00 | 0.00 | 0.000200 | 0.002878 | 0.0510 | 0.902 | 0.000199 | 0.000129 | 0.0514 | 0.901 |
| Y | 1.00 | 0.00 | −0.000062 | | | | −0.000071 | | | |
| | | | | | | | | COMPOSITE RMS FOR POSITION 1: | 0.05156 | |

Reduction in Strehl ratio between monochromatic and polychromatic cases represents the
contrast loss from chromatic aberrations over the spectral band
WL = 193.3074 193.3069 193.3065 193.306 193.3057 193.3055 193.3046
WTW = 11 29 60 100 69 17 5

| X | 0.00 | 0.00 | 0.000000 | 0.007964 | 0.0650 | 0.846 | 0.000000 | 0.002451 | 0.0662 | 0.841 |
| Y | 1.00 | 0.00 | 0.000105 | | | | 0.000089 | | | |
| X | 0.50 | 0.00 | 0.000008 | −0.004436 | 0.0317 | 0.961 | 0.000010 | 0.002451 | 0.0352 | 0.952 |
| Y | 1.00 | 0.00 | 0.000068 | | | | 0.000087 | | | |
| X | 0.70 | 0.00 | 0.000107 | 0.000998 | 0.0584 | 0.874 | 0.000108 | 0.002451 | 0.0585 | 0.873 |
| Y | 1.00 | 0.00 | −0.000077 | | | | −0.000073 | | | |
| X | 1.00 | 0.00 | 0.000195 | 0.005229 | 0.0558 | 0.884 | 0.000194 | 0.002451 | 0.0562 | 0.883 |
| Y | 1.00 | 0.00 | −0.000063 | | | | −0.000072 | | | |
| | | | | | | | | COMPOSITE RMS FOR POSITION 1: | 0.05526 | |

TABLE 3A

Description of Optical Train of the Embodiment 300 of FIG. 3A.

| ELEMENT NUMBER | RADIUS OF CURVATURE FRONT | RADIUS OF CURVATURE BACK | THICKNESS | APERTURE DIAMETER FRONT | APERTURE DIAMETER BACK | GLASS |
|---|---|---|---|---|---|---|
| OBJECT | | INF | 1.0000 | | | 'Water' |
| 2 | INF | −8.2303 CX | 6.4351 | 6.5264 | 14.3201 | 'SiO2' |
| | | | 0.1435 | | | |
| 3 | S(1) | −18.8001 CX | 6.7222 | 22.5825 | 27.5686 | 'SiO2' |
| | | | 0.1435 | | | |
| 4 | S(2) | −30.0784 CX | 8.5273 | 35.6362 | 39.1897 | 'SiO2' |
| | | | 0.1435 | | | |
| 5 | S(3) | −38.4857 CX | 9.4617 | 44.1620 | 46.6075 | 'SiO2' |
| | | | APERTURE STOP | 46.6075 | | |
| | | | 0.2869 | | | |
| 6 | 166.3155 CX | S(4) | 10.0143 | 49.0041 | 49.4058 | 'SiO2' |
| | | | 23.5239 | | | |
| 7 | 173.2270 CX | −162.8488 CX | 7.3700 | 54.0004 | 53.9884 | 'SiO2' |
| | | | 9.4810 | | | |
| 8 | −154.6474 CC | −86.1299 CX | 8.2671 | 52.1115 | 52.1002 | 'SiO2' |
| | | | 0.2096 | | | |
| 9 | A(1) | −138.6302 CX | 3.7500 | 51.9125 | 52.2633 | 'SiO2' |
| | | | 22.8744 | | | |
| 10 | 71.0710 CX | 535.1092 CC | 6.8489 | 49.1146 | 48.1285 | 'SiO2' |
| | | | 57.9463 | | | |
| 11 | −54.3888 CC | A(2) | 29.9969 | 22.0496 | 17.8257 | 'SiO2' |
| | | | 3.7833 | | | |
| 12 | −53.1248 CC | −32.8926 CX | 8.9225 | 18.0343 | 19.6876 | 'SiO2' |
| | | | 11.1925 | | | |
| 13 | 465.4200 CX | A(3) | 7.3473 | 19.3068 | 19.1032 | 'SiO2' |
| | | | 42.9871 | | | |
| | | DECENTER(1) | | | | |

TABLE 3A-continued

Description of Optical Train of the Embodiment 300 of FIG. 3A.

| | | | | | | |
|---|---|---|---|---|---|---|
| 14 | INF | | −43.0547 | C-1 | | REFL |
| 15 | −140.8055 CX | A(4) | −29.9980 | 26.7472 | 29.2969 | |
| | | | −34.1845 | | | |
| 16 | 59.5352 CC | −59.2154 CC | −30.0000 | 24.5566 | 26.7873 | 'SiO2' |
| | | | −13.0243 | | | |
| 17 | A(5) | −37.3543 CC | −2.5824 | 31.4897 | 31.9462 | 'SiO2' |
| | | | −38.4141 | | | |
| 18 | 73.1939 CC | | 38.4141 | 56.3111 | | REFL |
| 19 | −37.3543 CC | A(6) | 2.5824 | 35.8758 | 35.8710 | |
| | | | 13.0243 | | | |
| 20 | −59.2154 CC | 59.5352 CC | 30.0000 | 31.4408 | 30.6241 | 'SiO2' |
| | | | 34.1845 | | | |
| 21 | A(7) | −140.8055 CX | 29.9980 | 40.2935 | 38.4955 | 'SiO2' |
| | | | 43.0547 | | | |
| | DECENTER( 2) | | | | | |
| | | | 32.6896 | | | |
| | | | 20.0054 | | | |
| 22 | A(8) | 69.7865 CC | 16.6301 | 21.7570 | 23.4641 | 'SiO2' |
| | | | 71.5676 | | | |
| 23 | A(9) | −47.3231 CX | 10.8672 | 45.7252 | 51.0228 | 'SiO2' |
| | | | 787.7006 | | | |
| 24 | INF | | −50.0000 | 237.4629 | | REFL |
| | DECENTER( 3) | | | | | |
| 25 | INF | | 150.0000 | C-2 | | REFL |
| 26 | 40540.8039 CX | −491.5484 CX | 44.9407 | 289.1237 | 292.7506 | 'SiO2' |
| | | | 0.1000 | | | |
| 27 | 540.7167 CX | −3584.5181 CX | 35.0000 | 288.7494 | 285.5192 | 'SiO2' |
| | | | 557.4266 | | | |
| | | | 0.0000 | 30.9950 | | |
| | | | | 30.9950 | | |
| | | | 448.8330 | | | |
| 28 | 2630.2809 CX | −397.1567 CX | 51.4661 | 192.3463 | 202.1249 | 'SiO2' |
| | | | 73.9364 | | | |
| 29 | 168.9589 CX | −2918.7765 CX | 76.1582 | 217.9061 | 200.8210 | 'SiO2' |
| | | | 7.8995 | | | |
| 30 | 131.1316 CX | 235.6712 CC | 35.0000 | 166.8410 | 147.9259 | 'SiO2' |
| | | | 16.5743 | | | |
| 31 | −652.1637 CC | 84.3649 CC | 8.0304 | 147.2153 | 121.3181 | 'SiO2' |
| | IMAGE DISTANCE = | | 144.6348 | | | |
| IMAGE | INF | | | 118.7353 | | |

APERTURE DATA

| | | DIAMETER | | DECENTER | | |
|---|---|---|---|---|---|---|
| APERTURE | SHAPE | X | Y | X | Y | ROTATION |
| C-1 | RECTANGLE | 19.328 | 8.000 | 0.000 | 9.000 | 0.0 |
| C-2 | RECTANGLE | 367.770 | 50.000 | 0.000 | −170.000 | 0.0 | aspheric constants $$Z = \frac{(CURV)Y^2}{1 + (1 - (1 + K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| ASPHERIC | CURV | K | A | B | C | D |
|---|---|---|---|---|---|---|
| | | E | F | G | H | J |
| A(1) | −0.788036E−02 | 0.00000000 | −1.60680E−06 | −5.71603E−10 | −7.95421E−13 | 1.61828E−15 |
| | | −6.85051E−18 | 1.52500E−20 | −2.15168E−23 | 1.70021E−26 | −5.74938E−30 |
| A(2) | 0.03313618 | 0.00000000 | −1.12080E−05 | 3.59225E−08 | −8.31387E−11 | −8.58999E−13 |
| | | 3.01032E−15 | 6.97263E−18 | 0.00000E+00 | 0.00000E+00 | 0.00000E+00 |
| A(3) | −0.01807134 | 0.00000000 | 2.44282E−07 | −5.88773E−09 | 1.90874E−11 | 5.73753E−15 |
| | | 0.00000E+00 | 0.00000E+00 | 0.00000E+00 | 0.00000E+00 | 0.00000E+00 |
| A(4) | 0.01839301 | 0.00000000 | −2.40018E−06 | 1.13544E−09 | −1.07358E−12 | 6.87182E−16 |
| | | 0.00000E+00 | 0.00000E+00 | 0.00000E+00 | 0.00000E+00 | 0.00000E+00 |
| A(5) | 0.206863E−02 | 0.00000000 | −1.78913E−05 | 1.98684E−09 | 2.29867E−11 | −5.17522E−14 |
| | | 5.67365E−17 | −2.60781E−20 | 0.00000E+00 | 0.00000E+00 | 0.00000E+00 |
| A(6) | 0.206863E−02 | 0.00000000 | −1.78913E−05 | 1.98684E−09 | 2.29867E−11 | −5.17522E−14 |
| | | 5.67365E−17 | −2.60781E−20 | 0.00000E+00 | 0.00000E+00 | 0.00000E+00 |
| A(7) | 0.01839301 | 0.00000000 | −2.40018E−06 | 1.13544E−09 | −1.07358E−12 | 6.87182E−16 |
| | | 0.00000E+00 | 0.00000E+00 | 0.00000E+00 | 0.00000E+00 | 0.00000E+00 |
| A(8) | −0.02941486 | 0.00000000 | −9.82126E−07 | −6.38630E−09 | 2.82716E−11 | −1.59921E−13 |
| | | 0.00000E+00 | 0.00000E+00 | 0.00000E+00 | 0.00000E+00 | 0.00000E+00 |

TABLE 3A-continued

Description of Optical Train of the Embodiment 300 of FIG. 3A.

| A(9) | −0.02047184 | 0.00000000 | 7.86549E−08 | 1.18534E−10 | −1.77852E−13 | 1.38406E−16 |
|---|---|---|---|---|---|---|
|  |  | 0.00000E+00 | 0.00000E+00 | 0.00000E+00 | 0.00000E+00 | 0.00000E+00 |

SPECIAL SURFACES (SPS types)
QCN SURFACES
$x = (Y/NRADIUS)^{**}2$ $$Z = \frac{(CURV)Y^2}{1 + (1 - (1+K)(CURV)^2 Y^2)^{1/2}} + x^2 * \left( (QC4)\overset{con}{\underset{0}{Q}}(x) + (QC6)\overset{con}{\underset{1}{Q}}(x) + \ldots + (QC30)\overset{con}{\underset{13}{Q}}(x) \right)$$

| ASPHERIC | CURV | NRADIUS (C2) | K (C1) | QC4 (C4) | QC6 (C5) | QC8 (C6) |
|---|---|---|---|---|---|---|
|  |  | QC10 (C7) | QC12 (C8) | QC14 (C9) | QC16 (C10) | QC18 (C11) |
|  |  | QC20 (C12) |  |  |  |  |
| S(1) | −0.375089E−01 | 0.117087E+02 | 0.000000E+00 | 0.781699E+00 | −0.111327E+00 | −0.752173E−02 |
|  |  | 0.189059E−02 | −0.165226E−02 | 0.132330E−03 | −0.400665E−04 | −0.154608E−04 |
|  |  | 0.381404E−05 |  |  |  |  |

| ASPHERIC | CURV | NRADIUS (C2) | K (C1) | QC4 (C4) | QC6 (C5) | QC8 (C6) |
|---|---|---|---|---|---|---|
|  |  | QC10 (C7) | QC12 (C8) | QC14 (C9) | QC16 (C10) | QC18 (C11) |
|  |  | QC20 (C12) |  |  |  |  |
| S(2) | −0.108880E−01 | 0.189520E+02 | 0.000000E+00 | 0.179588E+00 | −0.243968E+00 | 0.129881E+00 |
|  |  | −0.269953E−01 | 0.723456E−02 | −0.134297E−02 | 0.138474E−03 | −0.167556E−03 |
|  |  | 0.920416E−05 |  |  |  |  |

| ASPHERIC | CURV | NRADIUS (C2) | K (C1) | QC4 (C4) | QC6 (C5) | QC8 (C6) |
|---|---|---|---|---|---|---|
|  |  | QC10 (C7) | QC12 (C8) | QC14 (C9) | QC16 (C10) | QC18 (C11) |
|  |  | QC20 (C12) |  |  |  |  |
| S(3) | −0.123451E−01 | 0.220374E+02 | 0.000000E+00 | 0.673702E+00 | 0.232005E+00 | −0.718514E−01 |
|  |  | 0.108260E−01 | −0.224315E−03 | −0.855525E−03 | 0.320809E−04 | 0.801810E−04 |
|  |  | −0.195269E−04 |  |  |  |  |

| ASPHERIC | CURV | NRADIUS (C2) | K (C1) | QC4 (C4) | QC6 (C5) | QC8 (C6) |
|---|---|---|---|---|---|---|
|  |  | QC10 (C7) | QC12 (C8) | QC14 (C9) | QC16 (C10) | QC18 (C11) |
|  |  | QC20 (C12) |  |  |  |  |
| S(4) | −0.810124E−02 | 0.230971E+02 | 0.000000E+00 | 0.101446E+01 | 0.356972E−01 | −0.207860E−02 |
|  |  | 0.217109E−02 | 0.423426E−03 | 0.307139E−04 | −0.463203E−05 | 0.168129E−05 |
|  |  | −0.616318E−06 |  |  |  |  |

DECENTERING CONSTANTS

| DECENTER | X | Y | Z | ALPHA | BETA | GAMMA |  |
|---|---|---|---|---|---|---|---|
| D(1) | 0.0000 | 0.0000 | 0.0000 | 45.0000 | 0.0000 | 0.0000 | (BEND) |
| D(2) | 0.0000 | 0.0000 | 0.0000 | 45.0000 | 0.0000 | 0.0000 | (RETU) |
| D(3) | 0.0000 | 0.0000 | 0.0000 | −45.0000 | 0.0000 | 0.0000 | (BEND) |

TABLE 3B

Monochromatic and Polychromatic Wavefront Aberrations and Corresponding Strehl Ratios of the Catadioptric Projection Lens (I, II) of the Embodiment 300 of FIG. 3A.

| | | | BEST INDIVIDUAL FOCUS | | | | BEST COMPOSITE FOCUS | | | |
|---|---|---|---|---|---|---|---|---|---|---|
| FIELD | FRACT | DEG | SHIFT (MM.) | FOCUS (MM.) | RMS (WAVES) | STREHL | SHIFT (MM.) | FOCUS (MM.) | RMS (WAVES) | STREHL |

Monochromatic rms wavefront aberrations and Strehl ratio - Wafer to SLM:
WL = 193.3074 193.3069 193.3065 193.306 193.3057 193.3055 193.3046 nm
WTW = 0 0 0 1 0 0 0

| X | 0.00 | 0.00 | 0.000000 | 0.039535 | 0.0022 | 1.000 | 0.000000 | 0.002739 | 0.0026 | 1.000 |
| Y | 1.00 | 0.00 | −0.003775 |  |  |  | 0.000046 |  |  |  |
| X | 0.50 | 0.00 | −0.000803 | −0.021277 | 0.0008 | 1.000 | −0.000004 | 0.002739 | 0.0011 | 1.000 |
| Y | 1.00 | 0.00 | 0.002507 |  |  |  | 0.000013 |  |  |  |
| X | 0.70 | 0.00 | −0.001107 | −0.021449 | 0.0017 | 1.000 | 0.000018 | 0.002739 | 0.0019 | 1.000 |
| Y | 1.00 | 0.00 | 0.002472 |  |  |  | −0.000040 |  |  |  |
| X | 1.00 | 0.00 | 0.000754 | 0.014220 | 0.0011 | 1.000 | −0.000008 | 0.002739 | 0.0011 | 1.000 |
| Y | 1.00 | 0.00 | −0.001178 |  |  |  | 0.000014 |  |  |  |
|  |  |  |  |  |  |  | COMPOSITE RMS |  | 0.00178 |  |

TABLE 3B-continued

Monochromatic and Polychromatic Wavefront Aberrations and Corresponding Strehl Ratios of the Catadioptric Projection Lens (I, II) of the Embodiment 300 of FIG. 3A.

| FIELD | FRACT | DEG | BEST INDIVIDUAL FOCUS | | | | BEST COMPOSITE FOCUS | | | |
|---|---|---|---|---|---|---|---|---|---|---|
| | | | SHIFT (MM.) | FOCUS (MM.) | RMS (WAVES) | STREHL | SHIFT (MM.) | FOCUS (MM.) | RMS (WAVES) | STREHL |

FOR POSITION 1:
Polychromatic rms wavefront aberrations and Strehl ratio - Wafer to SLM:
Reduction in Strehl ratio between monochromatic and polychromatic cases represents the contrast loss from chromatic aberrations over the spectral band
WL = 193.3074 193.3069 193.3065 193.306 193.3057 193.3055 193.3046
WTW = 11 29 60 100 69 17 5

| FIELD | FRACT | DEG | SHIFT (MM.) | FOCUS (MM.) | RMS (WAVES) | STREHL | SHIFT (MM.) | FOCUS (MM.) | RMS (WAVES) | STREHL |
|---|---|---|---|---|---|---|---|---|---|---|
| X | 0.00 | 0.00 | 0.000000 | 0.171069 | 0.0173 | 0.988 | 0.000000 | 0.133909 | 0.0173 | 0.988 |
| Y | 1.00 | 0.00 | −0.003792 | | | | 0.000067 | | | |
| X | 0.50 | 0.00 | −0.000805 | 0.110031 | 0.0172 | 0.988 | −0.000011 | 0.133909 | 0.0172 | 0.988 |
| Y | 1.00 | 0.00 | 0.002513 | | | | 0.000034 | | | |
| X | 0.70 | 0.00 | −0.001119 | 0.109673 | 0.0172 | 0.988 | 0.000009 | 0.133909 | 0.0172 | 0.988 |
| Y | 1.00 | 0.00 | 0.002497 | | | | −0.000020 | | | |
| X | 1.00 | 0.00 | 0.000711 | 0.144938 | 0.0172 | 0.988 | −0.000021 | 0.133909 | 0.0172 | 0.988 |
| Y | 1.00 | 0.00 | −0.001111 | | | | 0.000034 | | | |
| | | | | | | | COMPOSITE RMS FOR POSITION 1: | | 0.01723 | |

TABLE 3C

Monochromatic and Polychromatic Wavefront Aberrations and Corresponding Strehl Ratios of the Overall Embodiment 300 of FIG. 3A.

| FIELD | FRACT | DEG | BEST INDIVIDUAL FOCUS | | | | BEST COMPOSITE FOCUS | | | |
|---|---|---|---|---|---|---|---|---|---|---|
| | | | SHIFT (MM.) | FOCUS (MM.) | RMS (WAVES) | STREHL | SHIFT (MM.) | FOCUS (MM.) | RMS (WAVES) | STREHL |

Monochromatic rms wavefront aberrations and Strehl ratio - Wafer to field framing plane:
Variation in best individual focus shows the residual field curvature
WL = 193.3074 193.3069 193.3065 193.306 193.3057 193.3055 193.3046
WTW = 0 0 0 1 0 0 0

| X | 0.00 | 0.00 | 0.000000 | 0.041154 | 0.0228 | 0.980 | 0.000000 | −0.002362 | 0.0236 | 0.978 |
| Y | 1.00 | 0.00 | 0.000279 | | | | 0.000268 | | | |
| X | 0.50 | 0.00 | −0.000064 | 0.017039 | 0.0056 | 0.999 | −0.000064 | −0.002362 | 0.0062 | 0.998 |
| Y | 1.00 | 0.00 | 0.000207 | | | | 0.000209 | | | |
| X | 0.70 | 0.00 | −0.000053 | 0.009362 | 0.0112 | 0.995 | −0.000054 | −0.002362 | 0.0113 | 0.995 |
| Y | 1.00 | 0.00 | 0.000121 | | | | 0.000124 | | | |
| X | 1.00 | 0.00 | 0.000235 | −0.083257 | 0.0165 | 0.989 | 0.000230 | −0.002362 | 0.0197 | 0.985 |
| Y | 1.00 | 0.00 | −0.000371 | | | | −0.000364 | | | |
| | | | | | | | COMPOSITE RMS FOR POSITION 1: | | 0.01670 | |

Polychromatic rms wavefront aberrations and Strehl ratio - Wafer to field framing plane:
Variation in best individual focus shows the residual field curvature
Reduction in Strehl ratio between monochromatic and polychromatic cases represents the contrast loss from chromatic aberrations over the spectral band
WL = 193.3074 193.3069 193.3065 193.306 193.3057 193.3055 193.3046
WTW = 11 29 60 100 69 17 5

| X | 0.00 | 0.00 | 0.000000 | 0.075248 | 0.0289 | 0.967 | 0.000000 | 0.032115 | 0.0295 | 0.966 |
| Y | 1.00 | 0.00 | 0.000307 | | | | 0.000296 | | | |
| X | 0.50 | 0.00 | −0.000073 | 0.051169 | 0.0186 | 0.986 | −0.000074 | 0.032115 | 0.0188 | 0.986 |
| Y | 1.00 | 0.00 | 0.000236 | | | | 0.000238 | | | |
| X | 0.70 | 0.00 | −0.000067 | 0.043788 | 0.0212 | 0.982 | −0.000068 | 0.032115 | 0.0212 | 0.982 |
| Y | 1.00 | 0.00 | 0.000151 | | | | 0.000154 | | | |
| X | 1.00 | 0.00 | 0.000213 | −0.047939 | 0.0248 | 0.976 | 0.000208 | 0.032115 | 0.0270 | 0.972 |
| Y | 1.00 | 0.00 | −0.000337 | | | | −0.000330 | | | |
| | | | | | | | COMPOSITE RMS FOR POSITION 1: | | 0.02453 | |

TABLE 4A

Description of Optical Train of the Embodiment 400 of FIG. 4.

| ELEMENT NUMBER | RADIUS OF CURVATURE FRONT | RADIUS OF CURVATURE BACK | THICKNESS | APERTURE DIAMETER FRONT | APERTURE DIAMETER BACK | GLASS |
|---|---|---|---|---|---|---|
| OBJECT | | INF | 1.0000 | | | 'Water' |
| 2 | INF | −8.2303 CX | 6.4351 | 6.5264 | 14.3201 | 'SiO2' |
| | | | 0.1435 | | | |
| 3 | S(1) | −18.8001 CX | 6.7222 | 22.5825 | 27.5686 | 'SiO2' |
| | | | 0.1435 | | | |
| 4 | S(2) | −30.0784 CX | 8.5273 | 35.6362 | 39.1897 | 'SiO2' |
| | | | 0.1435 | | | |
| 5 | S(3) | −38.4857 CX | 9.4617 | 44.1620 | 46.6075 | 'SiO2' |
| | | | APERTURE STOP | 46.6075 | | |
| | | | 0.2869 | | | |
| 6 | 166.3155 CX | S(4) | 10.0143 | 49.0041 | 49.4058 | 'SiO2' |
| | | | 23.5239 | | | |
| 7 | 173.2270 CX | −162.8488 CX | 7.3700 | 54.0004 | 53.9884 | 'SiO2' |
| | | | 9.4810 | | | |
| 8 | −154.6474 CC | −86.1299 CX | 8.2671 | 52.1115 | 52.1002 | 'SiO2' |
| | | | 0.2096 | | | |
| 9 | A(1) | −138.6302 CX | 3.7500 | 51.9125 | 52.2633 | |
| | | | 22.8744 | | | |
| 10 | 71.0710 CX | 535.1092 CC | 6.8489 | 49.1146 | 48.1285 | 'SiO2' |
| | | | 57.9463 | | | |
| 11 | −54.3888 CC | A(2) | 29.9969 | 22.0496 | 17.8257 | 'SiO2' |
| | | | 3.7833 | | | |
| 12 | −53.1248 CC | −32.8926 CX | 8.9225 | 18.0343 | 19.6876 | 'SiO2' |
| | | | 11.1925 | | | |
| 13 | 465.4200 CX | A(3) | 7.3473 | 19.3068 | 19.1032 | 'SiO2' |
| | | | 42.9871 | | | |
| | DECENTER(1) | | | | | |
| 14 | | INF | −43.0547 | C-1 | | REFL |
| 15 | −140.8055 CX | A(4) | −29.9980 | 26.7472 | 29.2969 | 'SiO2' |
| | | | −34.1845 | | | |
| 16 | 59.5352 CC | −59.2154 CC | −30.0000 | 24.5566 | 26.7873 | 'SiO2' |
| | | | −13.0243 | | | |
| 17 | A(5) | −37.3543 CC | −2.5824 | 31.4897 | 31.9462 | 'SiO2' |
| | | | −38.4141 | | | |
| 18 | | 73.1939 CC | 38.4141 | 56.3111 | | REFL |
| 19 | −37.3543 CC | A(6) | 2.5824 | 35.8758 | 35.8710 | 'SiO2' |
| | | | 13.0243 | | | |
| 20 | −59.2154 CC | 59.5352 CC | 30.0000 | 31.4408 | 30.6241 | 'SiO2' |
| | | | 34.1845 | | | |
| 21 | A(7) | −140.8055 CX | 29.9980 | 40.2935 | 38.4955 | 'SiO2' |
| | | | 43.0547 | | | |
| | DECENTER(2) | | | | | |
| | | | 32.6896 | | | |
| | | | 20.0054 | | | |
| 22 | A(8) | 69.7865 CC | 16.6301 | 21.7570 | 23.4641 | 'SiO2' |
| | | | 71.5676 | | | |
| 23 | A(9) | −47.3231 CX | 10.8672 | 45.7252 | 51.0228 | 'SiO2' |
| | | | 787.7006 | | | |
| 24 | | INF | −50.0000 | 237.4629 | | REFL |
| | DECENTER(3) | | | | | |
| 25 | | INF | 150.0000 | C-2 | | REFL |
| 26 | 1020.7892 CX | −440.5935 CX | 44.9407 | 291.7619 | 292.3233 | 'SiO2' |
| | | | 86.9784 | | | |
| 27 | −282.8413 CC | −409.0313 CX | 35.0000 | 267.7683 | 276.3214 | 'SiO2' |
| | | | 457.4266 | | | |
| | DECENTER ( 4) | | | | | |
| 28 | | INF | −100.0000 | C-3 | | REFL |
| 29 | | 754.6155 CC | 361.7155 | 218.6596 | | REFL |
| 30 | −813.6819 CC | 98.9319 CC | 19.7149 | 39.3317 | 49.4552 | 'SiO2' |
| | | | 3.9591 | | | |
| 31 | −981.5537 CC | −89.9106 CX | 20.0000 | 50.0401 | 60.6842 | 'SiO2' |
| | | | 79.9587 | | | |
| 32 | −793.5946 CC | −101.2088 CX | 23.0169 | 119.0006 | 121.4729 | 'SiO2' |
| | IMAGE DISTANCE = | | 100.0000 | | | |
| IMAGE | | INF | | | 118.6588 | 'SiO2' |

TABLE 4A-continued

Description of Optical Train of the Embodiment 400 of FIG. 4.

APERTURE DATA

| APERTURE | SHAPE | DIAMETER | | DECENTER | | ROTATION |
|---|---|---|---|---|---|---|
| | | X | Y | X | Y | |
| C-1 | RECTANGLE | 19.328 | 8.000 | 0.000 | 9.000 | 0.0 |
| C-2 | RECTANGLE | 367.770 | 40.000 | 0.000 | −160.000 | 0.0 |
| C-3 | RECTANGLE | 312.758 | 60.000 | 0.000 | −140.000 | 0.0 | aspheric constants $$Z = \frac{(CURV)Y^2}{1 + (1 - (1+K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| ASPHERIC | CURV | K | A | B | C | D |
|---|---|---|---|---|---|---|
| | | E | F | G | H | J |
| A(1) | −0.788036E−02 | 0.00000000 | −1.60680E−06 | −5.71603E−10 | −7.95421E−13 | 1.61828E−15 |
| | | −6.85051E−18 | 1.52500E−20 | −2.15168E−23 | 1.70021E−26 | −5.74938E−30 |
| A(2) | 0.03313618 | 0.00000000 | −1.12080E−05 | 3.59225E−08 | −8.31387E−11 | −8.58999E−13 |
| | | 3.01032E−15 | 6.97263E−18 | 0.00000E+00 | 0.00000E+00 | 0.00000E+00 |
| A(3) | −0.01807134 | 0.00000000 | 2.44282E−07 | −5.88773E−09 | 1.90874E−11 | 5.73753E−15 |
| | | 0.00000E+00 | 0.00000E+00 | 0.00000E+00 | 0.00000E+00 | 0.00000E+00 |
| A(4) | 0.01839301 | 0.00000000 | −2.40018E−06 | 1.13544E−09 | −1.07358E−12 | 6.87182E−16 |
| | | 0.00000E+00 | 0.00000E+00 | 0.00000E+00 | 0.00000E+00 | 0.00000E+00 |
| A(5) | 0.206863E−02 | 0.00000000 | −1.78913E−05 | 1.98684E−09 | 2.29867E−11 | −5.17522E−14 |
| | | 5.67365E−17 | −2.60781E−20 | 0.00000E+00 | 0.00000E+00 | 0.00000E+00 |
| A(6) | 0.206863E−02 | 0.00000000 | −1.78913E−05 | 1.98684E−09 | 2.29867E−11 | −5.17522E−14 |
| | | 5.67365E−17 | −2.60781E−20 | 0.00000E+00 | 0.00000E+00 | 0.00000E+00 |
| A(7) | 0.01839301 | 0.00000000 | −2.40018E−06 | 1.13544E−09 | −1.07358E−12 | 6.87182E−16 |
| | | 0.00000E+00 | 0.00000E+00 | 0.00000E+00 | 0.00000E+00 | 0.00000E+00 |
| A(8) | −0.02941486 | 0.00000000 | −9.82126E−07 | −6.38630E−09 | 2.82716E−11 | −1.59921E−13 |
| | | 0.00000E+00 | 0.00000E+00 | 0.00000E+00 | 0.00000E+00 | 0.00000E+00 |
| A(9) | −0.02047184 | 0.00000000 | 7.86549E−08 | 1.18534E−10 | −1.77852E−13 | 1.38406E−16 |
| | | 0.00000E+00 | 0.00000E+00 | 0.00000E+00 | 0.00000E+00 | 0.00000E+00 |

SPECIAL SURFACES (SPS types)
QCN SURFACES
$x = (Y/NRADIUS)^{**}2$ $$Z = \frac{(CURV)Y^2}{1 + (1 - (1+K)(CURV)^2 Y^2)^{1/2}} + x^2 * \left( (QC4) Q_0^{con}(x) + (QC6) Q_1^{con}(x) + \ldots + (QC30) Q_{13}^{con}(x) \right)$$

| ASPHER-IC | CURV | NRADIUS (C2) QC10 (C7) QC20 (C12) | K (C1) QC12 (C8) | QC4 (C4) QC14 (C9) | QC6 (C5) QC16 (C10) | QC8 (C6) QC18 (C11) |
|---|---|---|---|---|---|---|
| S(1) | −0.375089E−01 | 0.117087E+02 0.189059E−02 0.381404E−05 | 0.000000E+00 −0.165226E−02 | 0.781699E+00 0.132330E−03 | −0.111327E+00 −0.400665E−04 | −0.752173E−02 −0.154608E−04 |

| ASPHER-IC | CURV | NRADIUS (C2) QC10 (C7) QC20 (C12) | K (C1) QC12 (C8) | QC4 (C4) QC14 (C9) | QC6 (C5) QC16 (C10) | QC8 (C6) QC18 (C11) |
|---|---|---|---|---|---|---|
| S(2) | −0.108880E−01 | 0.189520E+02 −0.269953E−01 0.920416E−05 | 0.000000E+00 0.723456E−02 | 0.179588E+00 −0.134297E−02 | −0.243968E+00 0.138474E−03 | 0.129881E+00 −0.167556E−03 |

| ASPHER-IC | CURV | NRADIUS (C2) QC10 (C7) QC20 (C12) | K (C1) QC12 (C8) | QC4 (C4) QC14 (C9) | QC6 (C5) QC16 (C10) | QC8 (C6) QC18 (C11) |
|---|---|---|---|---|---|---|
| S(3) | −0.123451E−01 | 0.220374E+02 0.108260E−01 −0.195269E−04 | 0.000000E+00 −0.224315E−03 | 0.673702E+00 −0.855525E−03 | 0.232005E+00 0.320809E−04 | −0.718514E−01 0.801810E−04 |

| ASPHER-IC | CURV | NRADIUS (C2) QC10 (C7) QC20 (C12) | K (C1) QC12 (C8) | QC4 (C4) QC14 (C9) | QC6 (C5) QC16 (C10) | QC8 (C6) QC18 (C11) |
|---|---|---|---|---|---|---|
| S(4) | −0.810124E−02 | 0.230971E+02 0.217109E−02 −0.616318E−06 | 0.000000E+00 0.423426E−03 | 0.101446E+01 0.307139E−04 | 0.356972E−01 −0.463203E−05 | −0.207860E−02 0.168129E−05 |

TABLE 4A-continued

Description of Optical Train of the Embodiment 400 of FIG. 4.

DECENTERING CONSTANTS

| DECENTER | X | Y | Z | ALPHA | BETA | GAMMA | |
|---|---|---|---|---|---|---|---|
| D(1) | 0.0000 | 0.0000 | 0.0000 | 45.0000 | 0.0000 | 0.0000 | (BEND) |
| D(2) | 0.0000 | 0.0000 | 0.0000 | 45.0000 | 0.0000 | 0.0000 | (RETU) |
| D(3) | 0.0000 | 0.0000 | 0.0000 | −45.0000 | 0.0000 | 0.0000 | (BEND) |
| D(4) | 0.0000 | 0.0000 | 0.0000 | −45.0000 | 0.0000 | 0.0000 | (BEND) |

TABLE 4B

Monochromatic and Polychromatic Wavefront Aberrations and Corresponding Strehl Ratios of the Overall Embodiment 400 of FIG. 4.

| | | | BEST INDIVIDUAL FOCUS | | | | BEST COMPOSITE FOCUS | | | |
|---|---|---|---|---|---|---|---|---|---|---|
| FIELD | FRACT | DEG | SHIFT (MM.) | FOCUS (MM.) | RMS (WAVES) | STREHL | SHIFT (MM.) | FOCUS (MM.) | RMS (WAVES) | STREHL |

Monochromatic rms wavefront aberrations and Strehl ratio - Wafer to field framing plane:
Variation in best individual focus shows the residual field curvature - much reduced when compared with Dioptric design
WL = 193.3074 193.3069 193.3065 193.306 193.3057 193.3055 193.3046 nm
WTW = 0 0 0 1 0 0 0

| | | | | | | | | | | |
|---|---|---|---|---|---|---|---|---|---|---|
| X | 0.00 | 0.00 | 0.000000 | 0.007905 | 0.0078 | 0.998 | 0.000000 | −0.002581 | 0.0079 | 0.998 |
| Y | 1.00 | 0.00 | −0.000181 | | | | −0.000182 | | | |
| X | 0.50 | 0.00 | 0.000030 | −0.006455 | 0.0033 | 1.000 | 0.000030 | −0.002581 | 0.0033 | 1.000 |
| Y | 1.00 | 0.00 | −0.000074 | | | | −0.000074 | | | |
| X | 0.70 | 0.00 | −0.000008 | −0.002172 | 0.0061 | 0.999 | −0.000008 | −0.002581 | 0.0061 | 0.999 |
| Y | 1.00 | 0.00 | 0.000032 | | | | 0.000032 | | | |
| X | 1.00 | 0.00 | −0.000080 | −0.009028 | 0.0040 | 0.999 | −0.000080 | −0.002581 | 0.0041 | 0.999 |
| Y | 1.00 | 0.00 | 0.000132 | | | | 0.000133 | | | |
| | | | | | | | COMPOSITE RMS FOR POSITION 1: | | 0.00565 | |

Polychromatic rms wavefront aberrations and Strehl ratio - Wafer to field framing plane:
Reduction in Strehl ratio between monochromatic and polychromatic cases represents the contrast loss from chromatic aberrations over the spectral band
WL = 193.3074 193.3069 193.3065 193.306 193.3057 193.3055 193.3046 nm
WTW = 11 29 60 100 69 17 5

| | | | | | | | | | | |
|---|---|---|---|---|---|---|---|---|---|---|
| X | 0.00 | 0.00 | 0.000000 | 0.041360 | 0.0188 | 0.986 | 0.000000 | 0.030520 | 0.0189 | 0.986 |
| Y | 1.00 | 0.00 | −0.000182 | | | | −0.000182 | | | |
| X | 0.50 | 0.00 | 0.000030 | 0.026927 | 0.0175 | 0.988 | 0.000030 | 0.030520 | 0.0175 | 0.988 |
| Y | 1.00 | 0.00 | −0.000074 | | | | −0.000074 | | | |
| X | 0.70 | 0.00 | −0.000008 | 0.030934 | 0.0181 | 0.987 | −0.000008 | 0.030520 | 0.0181 | 0.987 |
| Y | 1.00 | 0.00 | 0.000032 | | | | 0.000032 | | | |
| X | 1.00 | 0.00 | −0.000081 | 0.023475 | 0.0175 | 0.988 | −0.000081 | 0.030520 | 0.0175 | 0.988 |
| Y | 1.00 | 0.00 | 0.000134 | | | | 0.000134 | | | |
| | | | | | | | COMPOSITE RMS FOR POSITION 1: | | 0.01801 | |

In one specific implementation of the projection optical system of the invention, the catadioptric projection lens is made to include first and second portions (such as, for example, portions I and II of the embodiment 200) such that the second portion is structured as a catadioptric optical system forming, in light received from the catadioptric illumination relay lens, an intermediate optical image at a location between elements of the second portion. In such specific implementation, the first portion of the catadioptric projection lens is structured as a dioptric optical unit disposed to transfer light from the location of the intermediate image to an image plane of the projection optical system to form of the intermediate optical image at the image plan. Such specific catadioptric projection lens is configured to satisfy a condition of $$A < \frac{|\beta_I|}{|\beta_T|} < B, \quad (1)$$

where $\beta_I$ denotes a magnification of the first portion of the catadioptirc projection lens, $\beta_T$ denotes a magnification of the whole catadioptric projection lens, A=4, B=30. As would be appreciated by a person of skill in the art, this implementation possesses an unexpected operational advantage over a catadioptric projection lens of a related art in that it avoids a situation of $$\frac{|\beta_I|}{|\beta_T|} > 30,$$

when the required value of the NA of the second portion is too large for practical purposes such that correction of aberrations of the catadioptric projection lens becomes prohibitively expensive. At the same time, by keeping the ratio of $$\frac{|\beta_I|}{|\beta_T|}$$

above 4, the magnification value of the first portion is keep from becoming so impractically large as to make it cost prohibitive to correct aberrations of the projection optical system. It may be preferred to set A=5 and B=25 for high optical performance of the projection optical system; and even more preferred to set B=21.

In another related specific implementation of the projection optical system of the invention, the catadioptric projection lens is structured to include first and second portions as discussed above and to satisfy a condition of $$C < \frac{|\beta_{II}|}{|\beta_T|} < D, \tag{2}$$

where $\beta_I$ denotes a magnification of the first portion of the catadioptric projection lens and C=6 and D=20. As would be appreciated by a person of skill in the art, this implementation possesses an unexpected operational advantage over a catadioptric projection lens of a related art in that it avoids a situation when the total length of the second portion is prohibitively large from the operational standpoint and when the magnification of the first portion is too high. (Such impractical situation corresponds to D>20 and is accompanied by aberrations of the projection optical system that are too high to correct at operationally reasonable cost.) At the same time, this specific implementation is operationally advantageous over the similar system characterized by $$C < \frac{|\beta_{II}|}{|\beta_T|}$$

where C<6, for which the value of NA of the second portion is so high that the resulting aberrations are impractical to correct. For high optical performance of the projection optical system of the invention, it may be preferred to set C=5; to improve the operational characteristics even further, the lower limit of condition (2) may be set to 7.7. yet in a more preferred embodiment, the upper limit D may be set to 14.

In yet another related specific implementation of the projection optical system of the invention, the catadioptric projection lens is structured to include a first and second portions as discussed above and to satisfy a condition of $$|\beta_{II}| < |\beta_I|, \tag{3}$$

to ensure high optical performance in conjunction with the digital scanner as disclosed above.

The following Table 5 illustrates non-limiting examples pertaining to configurations of the catadioptric projection lens of the projection optical system of the invention:

TABLE 5

| Condition | Example A | Example B | Example C | Example D |
|---|---|---|---|---|
| $|\beta_T|$ | 0.1 | 0.1 | 0.1 | 0.1 |
| $|\beta_{II}|$ | 0.2 | 0.2 | 0.05 | 0.05 |
| $|\beta_T|$ | 0.02 | 0.02 | 0.005 | 0.005 |
| $|\beta_I|/|\beta_T|$ | 5 | 5 | 20 | 20 |
| $|\beta_{II}|/|\beta_T|$ | 10 | 10 | 10 | 10 |

Figure 10:
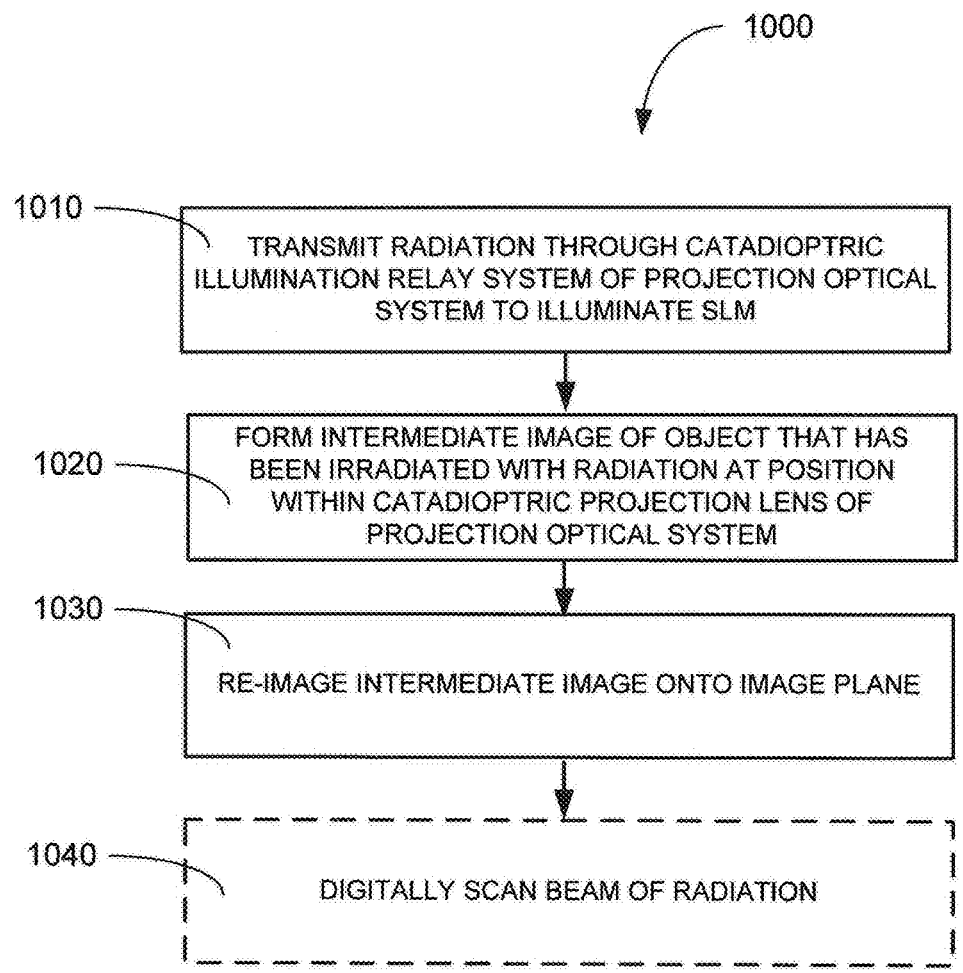
FIG. 10 is a flow-chart illustrating a method for forming an optical image with an embodiment of the projection optical system.

An example of forming an optical image with an embodiment of the projection optical system according to the invention is schematically illustrated by a flow-chart 1000 in FIG. 10. At step 1010, radiation that has been transmitted through a catadioptric illumination relay system structured according to an embodiment of the invention as discussed above is received with an SLM. At step 1020, radiation received by the SLM through a catadioptric projection lens of the embodiment is reflected by the SLM to form an image such that chromatic errors induced in the image are at least partially reduced. As a result of such reflection, an intermediate image of an object irradiated with the radiation can be formed within the catadioptric projection lens (for example, between the elements of such lens). The intermediate image is further re-imaged, at step 1030, through the catadioptric projection lens and fluid or liquid to form as image of the object at the image plane. Optionally, at step 1040, a beam defined by the radiation received at the SLM, is digitally scanned (for example, with a digital scanner system used in conjunction with the embodiment). The radiation at hand may have a bandwidth on the order of 1 picometer, in one implementation from about half a picometer to several picometers (for example, 2-3 picometers).

It is notable, that a second portion of a catadioptric projection lens of an embodiments of the invention includes the combination of the two negative lenses 16, 17 (see, for example, the portion labeled II in the embodiment of FIG. 2A or that of FIG. 4, the projection lens of which is structured in a similar fashion) and, for that reason, is configured differently from similar portion that related art has been utilizing to date. In particular, catadioptric projection lenses of the projection systems of the related art include only one, single lens in place of the combination of lenses 16, 17 used herein. Such single lens is known to some as a Schupmann lens, which conventionally, is a single negative-power meniscus lens element placed close to a concave mirror of the projection lens. According to the idea of the present invention, two such lens elements are used instead, which provides the proposed designed with more degrees of freedom for correction of aberrations, in particular spherical aberration and coma. (For proper comparison of the operation of the embodiments of FIGS. 2A, 2B and 4 with projection systems of FIGS. 1A-1C and 3A-3C that are structured conventionally, the combination of two negative-power meniscus elements in used in each of the corresponding catadioptric projection lens. See also data in the Tables.)

References made throughout this specification to "one embodiment," "an embodiment," "a related embodiment," or similar language mean that a particular feature, structure, or characteristic described in connection with the referred to "embodiment" is included in at least one embodiment of the present invention. Thus, appearances of these phrases and terms may, but do not necessarily, refer to the same implementation. It is to be understood that no portion of disclosure, taken on its own and in possible connection with a figure, is intended to provide a complete description of all features of the invention.

It is also to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed.

The invention as recited in claims appended to this disclosure is intended to be assessed in light of the disclosure as a whole, including features disclosed in prior art to which reference is made.

While the description of the invention is presented through the above examples of embodiments, those of ordinary skill in the art understand that modifications to, and variations of, the illustrated embodiments may be made without departing from the inventive concepts disclosed herein. The invention should not be viewed as being limited to the disclosed examples.

What is claimed is:

1. A projection optical system configured to form an image on a substrate and including a catadioptric illumination relay lens, a catadioptric projection lens, and a spatial light modulator (SLM) positioned to receive light from the catadioptric illumination relay lens and reflect said light towards the catadioptric projection lens,
   wherein the catadioptric projection lens includes first and second portions in optical communication with one another,
   said second portion configured as a catadioptric optical system forming, in light received from the catadioptric illumination relay lens, an intermediate optical image at a location between elements of the second portion;
   said first portion located between the second portion and an image plane of the projection optical system, said first portion configured as a dioptric optical system disposed to transfer light from said location to the image plane of the projection optical system to form said image at the image plane of the projection optical system,
   said catadioptric projection lens configured to satisfy a condition of $|\beta_{II}| < |\beta_{I}|$, wherein $\beta_I$ denotes a magnification of the first portion and $\beta_{II}$ denotes a magnification of the second portion.

2. A digital scanner comprising the projection optical system according to claim 1.

3. A digital scanner according to claim 2, wherein the light includes UV light and has a spectral bandwidth on the order of 1 picometer.

4. A projection optical system according to claim 1, having a numerical aperture of 1.0 or higher.

5. A projection optical system according to claim 1, configured to form the image with at least 50× reduction ratio.

6. A projection optical system according to claim 5, an operation of which in light having a central wavelength of about 193.3 nm and a spectral bandwidth of about 1 picometer is characterized by a first Strehl ratio at the central wavelength and a second Strehl ratio across the spectral bandwidth, both the first and second Strehl ratios exceeding 0.95.

7. A projection optical system according to claim 1, configured to form the image with at least 200× reduction ratio.

8. A projection optical system according to claim 1, an operation of which in light having a central wavelength of about 193.3 nm and a spectral bandwidth of about 1 picometer is characterized by a first Strehl ratio at the central wavelength and a second Strehl ratio across the spectral bandwidth, both the first and second Strehl ratios exceeding 0.98.

9. A projection optical system according to claim 1, wherein the SLM is positioned to receive light that has been reflected by a first spherical mirror and to reflect light towards a second spherical mirror such as to form an intermediate image within the catadioptric projection lens.

10. A projection optical system according to claim 1, wherein
    said catadioptric projection lens is configured to satisfy a condition of $$4 < \frac{|\beta_I|}{|\beta_T|} < 30,$$

wherein $\beta_I$ denotes a magnification of the first portion and $\beta_T$ denotes a magnification of the catadioptric projection lens.

11. A projection optical system according to claim 1, wherein
    said catadioptric projection lens is configured to satisfy a condition of $$6 < \frac{|\beta_{II}|}{|\beta_T|} < 20,$$

wherein $\beta_{II}$ denotes a magnification of the second portion and $\beta_T$ denotes a magnification of the catadioptric projection lens.

12. A projection optical system according to claim 1, wherein
    said second portion is configured such that said light passes through a first group of lenses including a first negative lens, then through a second group of lenses, and then is reflected with a concave mirror to form a reflected beam transmitted through the second group of lenses.

13. A projection optical system according to claim 12, wherein the second group of lenses includes second and third negative lenses immediately adjacent to one another, a concave surface of the second negative lens facing away from the concave mirror, a concave surface of the third negative lens facing the concave mirror.

14. A projection optical system according to claim 13, wherein the second group of lenses further comprises a positive lens between the first group of lenses and the third negative lens.

15. A projection optical system according to claim 12, wherein the first portion comprises at least two positive lenses disposed immediately adjacent to one another such as to receive light directly from said location.

16. A projection optical system according to claim 15, wherein the first portion further comprises at least two negative lenses disposed immediately adjacent to one another between said at least two positive lenses and the image plane.

17. A method for forming an image with a projection optical system comprising:

receiving radiation transmitted through a catadioptric illumination relay of the projection optical system with a spatial light modulator (SLM); and reflecting radiation received by the SLM through a catadioptric projection lens of the projection optical system to form the image such that chromatic errors induced in the image are at least partially reduced, wherein the reflecting includes forming an intermediate image within the catadioptric projection lens between first and second portions of the catadioptric projection lens, said second portion configured as a catadioptric optical system to transfer light from the SLM to a location of the intermediate image, said first portion configured as a dioptric optical system disposed to transfer light from said location to an image plane of the projection optical system, the catadioptric projection lens configured to satisfy a condition of $$6 < \frac{|\beta_{II}|}{|\beta_T|} < 20,$$

wherein $\beta_{II}$ denotes a magnification of the second portion and $\beta_T$ denotes a magnification of the catadioptric projection lens.

18. A method according to claim 17, further comprising digitally scanning a beam of radiation transmitted through the catadioptric illumination relay with the SLM.

19. A method according to claim 17, wherein the reflecting radiation received by the SLM includes transmitting said radiation by the SLM through the catadioptric projection lens configured to satisfy a condition of $$4 < \frac{|\beta_I|}{|\beta_T|} < 30,$$

wherein $\beta_I$ denotes a magnification of the first portion and $\beta_T$ denotes a magnification of the catadioptric projection lens.

20. A method according to claim 17, wherein said forming an intermediate image includes transmitting the radiation that has been received by the SLM from the catadioptric illumination relay through a first group of lenses including a first negative lens, then transmitting said radiation through a second group of lenses, then reflecting said radiation with a concave mirror to form a reflected beam to transmit said reflected beam through the second group of lenses.

21. A method according to claim 20, wherein the transmitting said radiation through a second group of lenses includes transmitting said radiation through second and third negative lenses immediately adjacent to one another, wherein a concave surface of the second negative lens is facing away from the concave mirror, while a concave surface of the third negative lens is facing the concave mirror.

22. A projection optical system configured to form an image on a substrate and including a catadioptric illumination relay lens, a catadioptric projection lens, and a spatial light modulator (SLM) positioned to receive light from the catadioptric illumination relay lens and reflect said light towards the catadioptric projection lens, wherein the catadioptric projection lens includes first and second portions in optical communication with one another, said second portion configured as a catadioptric optical system forming, in light received from the catadioptric illumination relay lens, an intermediate optical image at a location between elements of the second portion;

said second portion configured such that said light passes through a first group of lenses including a first negative lens, then through a second group of lenses, and then is reflected with a concave mirror to form a reflected beam transmitted through the second group of lenses;

said first portion configured as a dioptric optical system disposed to transfer light from said location to an image plane of the projection optical system to form an image of the intermediate optical image at the image plane, wherein the second group of lenses includes second and third negative lenses immediately adjacent to one another, a concave surface of the second negative lens facing away from the concave mirror, a concave surface of the third negative lens facing the concave mirror.

* * * * *